US011133371B2

(12) United States Patent
Ohara

(10) Patent No.: US 11,133,371 B2
(45) Date of Patent: Sep. 28, 2021

(54) DISPLAY DEVICE

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 96 days.

(21) Appl. No.: 16/811,677

(22) Filed: Mar. 6, 2020

(65) Prior Publication Data

US 2020/0203467 A1 Jun. 25, 2020

Related U.S. Application Data

(63) Continuation of application No. PCT/JP2018/023125, filed on Jun. 18, 2018.

(30) Foreign Application Priority Data

Sep. 11, 2017 (JP) ............................ JP2017-173991

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01)

(58) Field of Classification Search
None
See application file for complete search history.

(56) References Cited

U.S. PATENT DOCUMENTS

2006/0249817 A1 11/2006 Kawase et al.
2007/0026662 A1 2/2007 Kawano et al.
2010/0091202 A1* 4/2010 Ostergard .............. B29C 70/12 349/11

(Continued)

FOREIGN PATENT DOCUMENTS

JP 2002-076621 A 3/2002
JP 2003-202816 A 7/2003

(Continued)

OTHER PUBLICATIONS

International Search Report dated Aug. 28, 2018 for the PCT application No. PCT/JP2018/023125, with English machine translation.

*Primary Examiner* — J. E. Schoenholtz
(74) *Attorney, Agent, or Firm* — Michael Best & Friedrich LLP

(57) ABSTRACT

A display device includes a substrate; an insulating layer in contact with a first surface of the substrate; a display region with a plurality of pixels each including a transistor and a display element on the insulating layer; a terminal region in a region outside the display region over the insulating layer; a wiring between the display region and the terminal region; and a resin film on the substrate. The insulating layer includes an opening in a region between the display region and the terminal region. The resin film is in contact with the first surface in the opening. The wiring is in contact with an upper surface of the resin film through the opening. A surface roughness of the resin film in the opening is larger than a surface roughness of the substrate at a region where the substrate is in contact with the insulating layer.

6 Claims, 18 Drawing Sheets

(56) References Cited

U.S. PATENT DOCUMENTS

| | | | | |
|---|---|---|---|---|
| 2013/0043065 | A1* | 2/2013 | Park | H05K 1/0366 174/254 |
| 2014/0065430 | A1 | 3/2014 | Yamazaki et al. | |
| 2016/0174304 | A1 | 6/2016 | Kim et al. | |

FOREIGN PATENT DOCUMENTS

| | | | |
|---|---|---|---|
| JP | 2005-159143 | A | 6/2005 |
| JP | 2006-278982 | A | 10/2006 |
| JP | 2007-035825 | A | 2/2007 |
| JP | 2009-007406 | A | 1/2009 |
| JP | 2017-126081 | A | 7/2017 |

* cited by examiner

104

DISPLAY DEVICE

CROSS REFERENCES TO RELATED APPLICATIONS

This application is based upon and claims the benefit of priority from the prior Japanese Patent Application No. 2017-173991 filed on Sep. 11, 2017, and PCT Application No. PCT/JP2018/023125 filed on Jun. 18, 2018, the entire contents of which are incorporated herein by reference.

FIELD

The present invention relates to a display device and a manufacturing method thereof. For example, the present invention relates to a display device including a light-emitting element and a manufacturing method thereof.

BACKGROUND

Examples of display devices include a liquid crystal display device and an organic light emitting diode (Electroluminescence) display device. These display devices has a liquid crystal element or an organic light-emitting element (hereinafter light-emitting element) as a display element in each of the plurality of pixels formed on a substrate. A liquid crystal element or a light-emitting element has a layer containing a liquid crystal compound or a layer containing a light-emitting organic compound (hereinafter, an electroluminescent layer or an EL layer) between a pair of electrodes (cathode and anode). The liquid crystal element or the light-emitting element is driven by applying a voltage between the electrodes, or by supplying a current.

By using a flexible substrate as the substrate, flexibility can be provided to the entire display device. This provides a display device with a curved shape or a user-freely deformable display device. The flexible substrate is formed as a flexible resin substrate by forming a back plane and a front plane on a glass substrate coated with a resin and then separating the grass substrate. However, when the underlying resin is used to form arrays on the resin, there are problems with the adhesion between the resin substrate and the metal wiring, which are bent portion. In particular, when an upper of a wiring is covered with a highly stressed silicon nitride film, peeling occurs significantly due to stress problems.

In the circuit substrate in the semiconductor field, it is known that by forming an unevenness on a base, the adhesion between an upper layer and the base can be improved and that it is possible to form the unevenness of the surface by a prepreg, for example, a configuration for roughening the surface of the resin when there is a wiring on the resin (see Japanese Laid Open Patent Publication No. 2007-035825), a configuration for roughening the surface of prepreg with an oxidizer (see Japanese Laid Open Patent Publication No. 2009-7406), or a configuration for forming a prepreg having an uneven surface and bonding a copper foil on the uneven surface in a multi-layer wiring substrate (see Japanese Laid Open Patent Publication No. 2002-76621).

SUMMARY

A display device according to an embodiment of the present invention includes a substrate, an insulating layer in contact with a first surface of the substrate, a display region in which a plurality of pixels including a transistor and a display element on the insulating layer are arranged, a terminal region located in a region outside the display region over the insulating layer, and a wiring between the display region and the terminal region. The insulating layer includes an opening which exposes the first surface of the substrate in a region between the display region and the terminal region. The wiring is in contact with an upper surface of the insulating layer and an exposed surface of the substrate in the opening. A surface roughness of the exposed surface of the substrate is larger than a surface roughness of a region in which the substrate is in contact with the insulating layer.

A display device according to an embodiment of the present invention includes a substrate, an insulating layer in contact with a first surface of the substrate, a display region in which a plurality of pixels each including a transistor and a display element on the insulating layer are arranged, a terminal region located in a region outside the display region over the insulating layer, a wiring between the display region and terminal region, and a resin film on the substrate. The substrate is a sheet-like member including fibers which are impregnated with a resin. The insulating layer includes an opening which exposes the first surface of the substrate in a region between the display region and the terminal region. The resin film is in contact with the first surface of the substrate in the opening of the insulating layer. The wiring is in contact with an upper surface of the resin film through the opening. A surface roughness of the resin film in the opening of the insulating layer is larger than a surface roughness of the substrate at a region where the substrate is in contact with the insulating layer.

DESCRIPTION OF EMBODIMENTS

An object of one embodiment of the present invention is to provide a highly reliable display device and a manufacturing method thereof. For example, an object of one embodiment of the present invention is to provide a flexible display device capable of maintaining high reliability even when deformed, and a manufacturing method thereof.

Hereinafter, each embodiment of the present invention will be described while referencing the drawings. However, it is possible to apply the present invention using various different aspects within a scope that does not depart aspect the concept of the present invention and the present invention should not be limited to the content described in the embodiments exemplified herein.

In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols and detailed descriptions are omitted accordingly.

In the description and claims, when a single film is processed to form a plurality of films, these films may have different functions and roles. However, the plurality of films are derived from films formed in the same layer by the same process and have the same layer structure and the same material. Therefore, these films are defined as existing in the same layer.

In the description and claims, in the case of simply denoting "above" when expressing a mode of in which another structure is arranged on a certain structure, unless otherwise noted a case where another structure is arranged directly above a certain structure as if in contact with that structure, and a case where another structure is arranged via another structure above a certain structure, are both included.

In the description, when referring to a plurality of similar components individually, it is denoted by using an underscore and a natural number after the sign. In the case of representing a plurality selected as a whole or arbitrarily among them without distinguishing them from each other, only codes are used.

The expression "one structure is exposed from another structure" herein and claims refer to an aspect in which a portion of a structure is not covered by another structure, and a portion, which is not covered by another structure, also includes an aspect in which it is covered by another structure.

First Embodiment

A structure of a display device 100 which is one of the embodiments of the present invention will be described below.

[1. Overall Structure]

Figure 1:
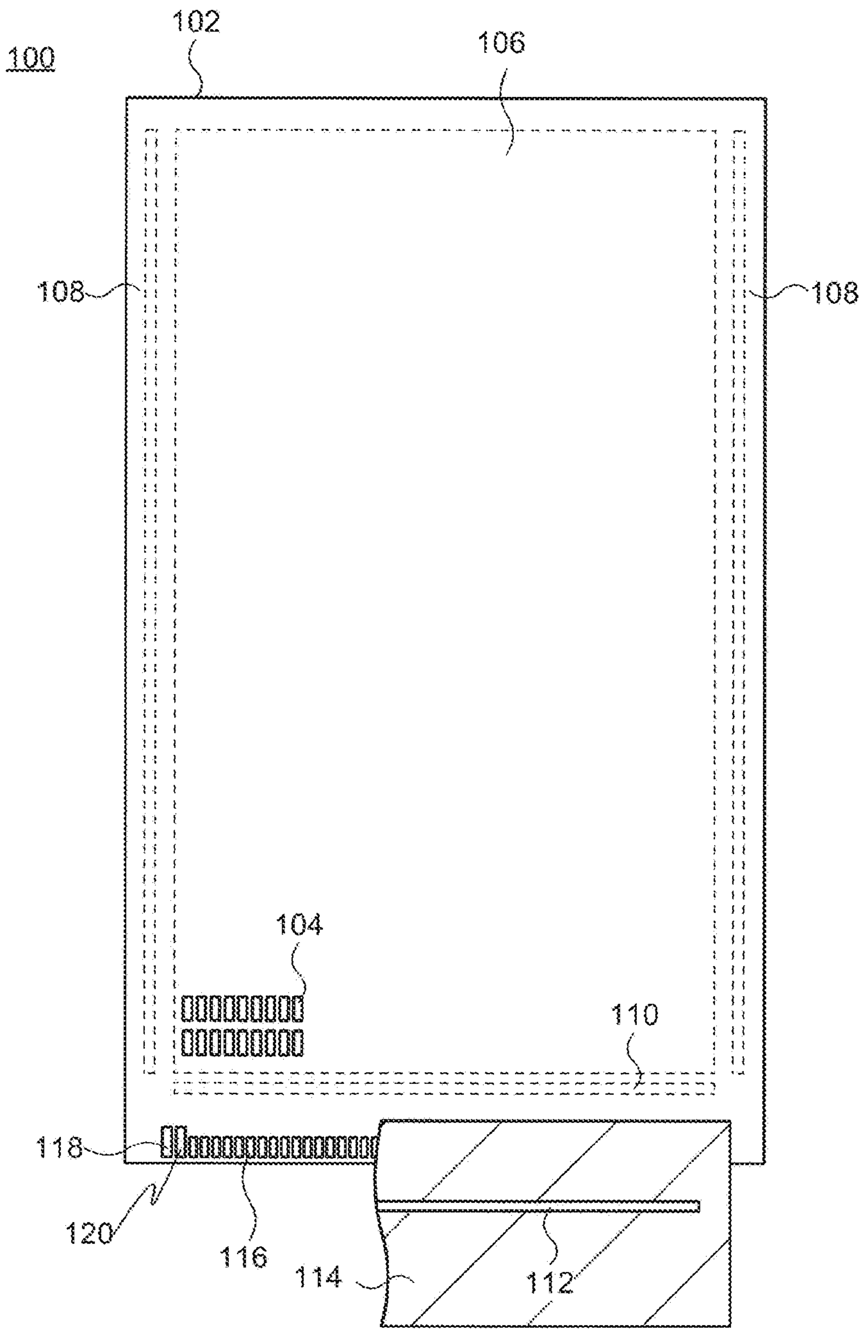
FIG. 1 is a schematic upper surface diagram of the display device according to an embodiment.

FIG. 1 shows an upper surface schematic diagram of the display device 100. The display device 100 includes a substrate 102 on which various patterned insulating films, a semiconductor film, and conductive films are formed. Driving circuits (a gate-sided driver circuit 108 and a source-sided driver circuit 110) for driving a plurality of pixels 104 or a pixel 104 are formed by using the insulating films, the semiconductor film, the conductive films. A plurality of pixels 104 is arranged periodically, by which a display region 106 is defined. As described below, a display element is provided on each of the pixels 104. Hereinafter, examples in which a light-emitting element 130 is formed in the pixel 104 as the display element will be described.

The substrate 102 is a flexible substrate and may be a resin film made of an organic resin material. The substrate 102 may include a polymer such as a polyimide, polyamide, polycarbonate, or the like. The thickness of the substrate 102 is approximately 5 μm to 100 μm, preferably 10 μm to 30 μm. Although not shown, the substrate 102 may have a structure in which a plurality of layers of the organic resin film and the inorganic insulating film are stacked, for example, one inorganic insulating film may have a structure sandwiched between the two organic resin film. In this case, it is desirable that the thickness of the substrate 102 is 10 μm to 30 μm. Further, the substrate 102 may have a structure in which an amorphous silicon film is sandwiched at the interface between the organic resin film and the inorganic insulating film, that is, the organic resin film, the amorphous silicon film, and the inorganic insulating film are stacked in order. In this case, the adhesion between the organic resin film and the amorphous silicon film and the adhesion between the inorganic insulating film and the amorphous silicon film are superior to the adhesion between the organic resin film and the inorganic insulating film. Therefore, in the structure in which the organic resin film and the amorphous silicon film and the inorganic insulating film are stacked in this order, peeling of the film is less likely to occur than in the structure in which the organic resin film and the inorganic insulating film are stacked. Further, the inorganic insulating film sandwiched between the two organic resin film may be a single layer such as a silicon oxide film, or may have a structure in which a plurality of layers are stacked, for example, a two-layer stacked structure of silicon oxide film/silicon nitride film, or three-layer stacked structure of silicon oxide film/silicon nitride film/silicon oxide film.

The gate-sided driver circuit 108 or the source-sided driver circuit 110 is disposed outside the display region 106 (peripheral region). Some wirings (not shown in FIG. 1) formed of patterned conductive films are extended from the display region 106, the gate-sided driver circuit 108, and the source-sided driver circuit 110 to one side of the substrate 102, and the wirings are exposed near an end of the substrate 102 to form terminals such as a video signal terminal 116, a power supply terminal 118 and 120. The terminals are electrically connected to a flexible printed circuit board (FPC) 114. In the example shown here, a driver IC 112 with integrated circuits formed on a semiconductor substrate is further mounted on the FPC 114. The function of the source-sided driver circuit 110 may be integrated into the driver IC 112, or the driver IC 112 may be mounted on the substrate 102 rather than on the FPC 114. Video signals are supplied from external circuitry (not shown) via the FPC 114 and the driver IC 112, and the video signals are supplied to the gate-sided driver circuit 108 or the source-sided driver circuit 110 via the video signal terminal 116. On the other hand, power supplied to the light-emitting element 130 in the pixel 104 is supplied to the display device 100 via the FPC 114, the power supply terminal 118 and 120. A high potential (PVDD) is supplied to the power supply terminal 120 and a lower potential (PVSS) than PVDD is supplied to the power supply terminal 118. The video signals and signals based on the potentials are supplied to each of the pixels 104 through a wiring 220 which is electrically connected to the terminals, and the pixel 104 is controlled and driven.

Figure 2:
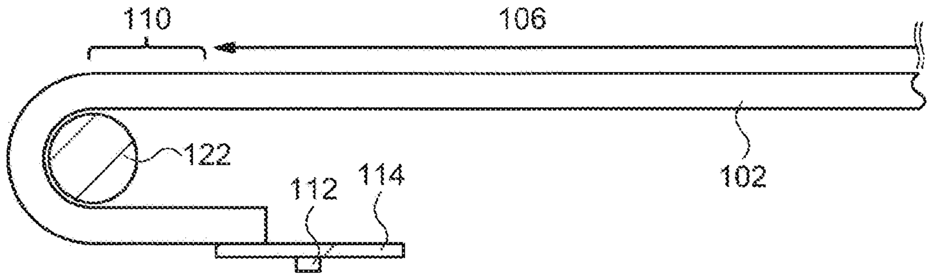
FIG. 2 is a schematic side surface diagram of the display device according to an embodiment.

By using a flexible substrate as the substrate 102, flexibility can be provided to the display device 100, for example, by bending the substrate 102 between the terminal and the display region 106 so that the FPC 114 or the terminal connected to the FPC 114 overlaps the display region 106, a three-dimensional structure as shown in side view of FIG. 2 can be provided. At this time, a spacer 122 may be provided to stabilize the folded shape. The spacer 122 is covered at least a part of its outer periphery by the substrate 102.

[2. Configuration of Pixel]

[2-1. Pixel Circuit]

In each of the pixel 104, the pixel circuit including the light-emitting 130 is formed by various patterned insulating films, a semiconductor film, and conductive films. The configuration of the pixel circuit can be arbitrarily selected, an example of which is shown in FIG. 3 as an equivalent circuit.

Figure 3:
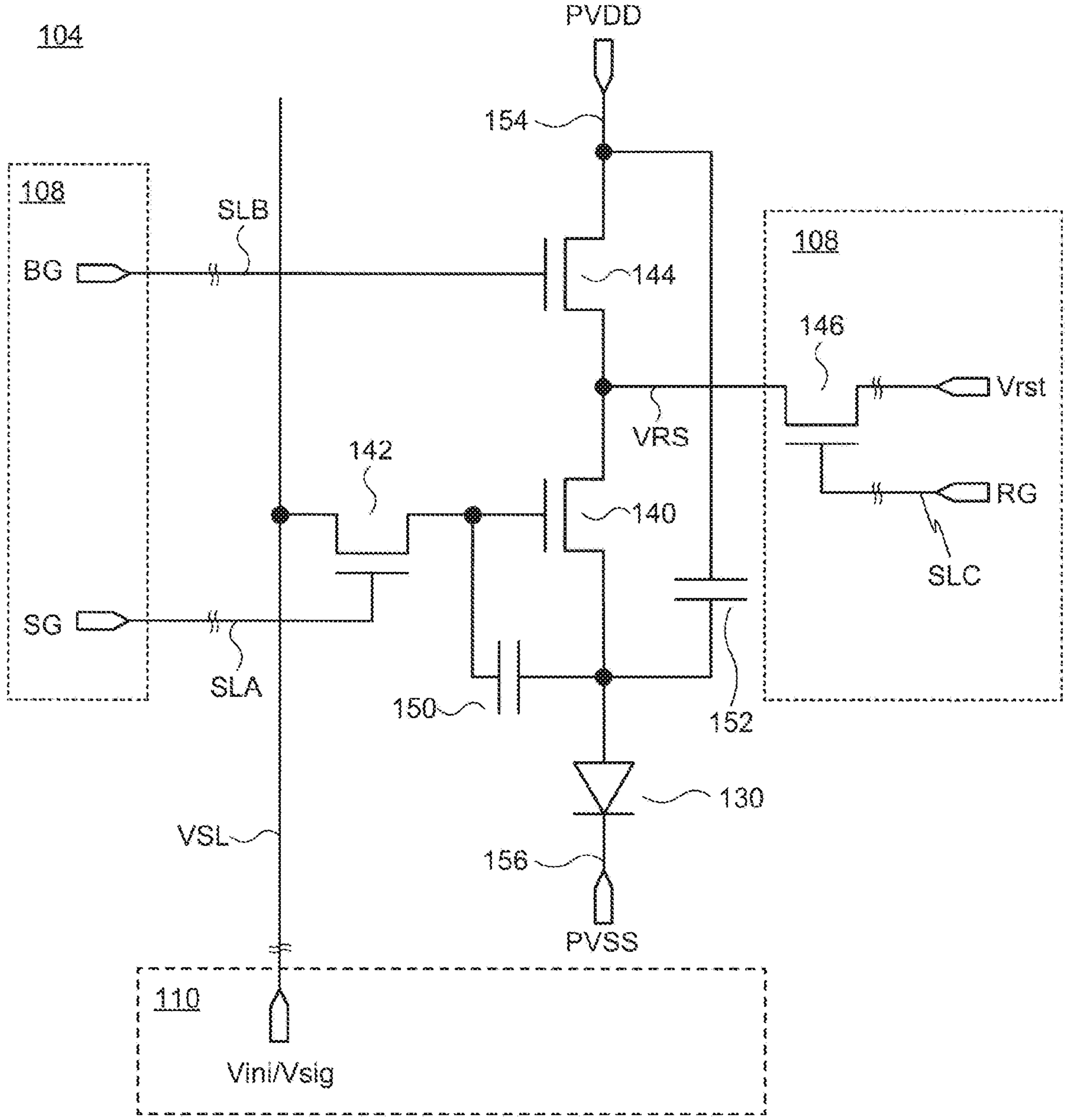
FIG. 3 is an example of an equivalent circuit of a pixel of the display device according to an embodiment.

The pixel circuit shown in FIG. 3, in addition to the light-emitting element 130, includes a driving transistor 140, a first switching transistor 142, a second switching transistor 144, a storage capacitor 150, and an additional capacitor 152. The light-emitting element 130, the driving transistor 140, the second switching transistor 144 are connected in series between a high voltage power supply line 154 and a low voltage power supply line 156. PVDD and PVSS are applied to the high voltage power supply line 154 and the low voltage power supply line 156, respectively.

In the embodiment, the driving transistor 140 is an n-channel type, an input and output terminal on the side of the high voltage power supply line 154 is a drain, and an input and output terminal on the side of the light-emitting element 130 is a source. The drain of the driving transistor 140 is electrically connected to the high voltage power supply line 154 through the second switching transistor 144, and the source is electrically connected to a pixel electrode 184 of the light-emitting element 130.

A gate of the driving transistor 140 is electrically connected to a first signal line VSL via the first switching transistor 142. The first switching transistor 142 is operated (on/off) is controlled by a scanning signal SG provided to a first scanning signal line SLA connected to the gate. When the first switching transistor 142 is on, the potential of the first signal line VSL is applied to the gate of the driving transistor 140. An initialization signal Vini and a video signal Vsig is supplied to a first signal line VSL at predetermined timings. The initialization signal Vini is a signal for applying a certain level of initialization potential. The first switching transistor 142 is turned on/off at predetermined timings in synchronization with the first signal line VSL, and applies a potential based on the initialization signal Vini or the video signal Vsig to the gate of the driving transistor 140.

Second signal line VRSs are electrically connected to the drain of the driving transistor 140. A reset potential Vrst is applied to a second signal line VRS via a third switching transistor 146. The timing at which the reset signal Vrst is applied through the third switching transistor 146 is controlled by a reset signal RG supplied to a third signal line SLC.

The storage capacitor 150 is provided between the source and the gate of the driving transistor 140. One terminal of the additional capacitor 152 is connected to the source of the driving transistor 140 and the other terminal is connected to the high voltage power supply line 154. The additional capacitor 152 may be provided so that the other terminal is connected to the low voltage power supply line 156. The storage capacitor 150 and the additional capacitor 152 are provided to hold the gate-source voltage Vgs corresponding to the video signal Vsig when the video signal Vsig is applied to the gate of the driving transistor 140.

The source-sided driver circuit 110 outputs the initialization signal Vini or the video signal Vsig to the first signal line VSL. On the other hand, the gate-sided driver circuit 108 outputs the scanning signal SG to the first scanning signal line SLA, and outputs a scanning signal BG to a second scanning signal line SLB, and outputs the reset signal RG to the third signal line SLC.

In the pixel circuit shown in FIG. 3, the driving transistor 140 and the first switching transistor 142 need to be provided in each of the pixels 104 shown in FIG. 1. On the other hand, the second switching transistor 144 may be shared between the plurality of adjacent pixels 104. As a specific example, the second switching transistor 144 can be shared between the plurality of pixels 104 belonging to the same scanning row and adjacent to each other. Further, although the third switching transistor 146 in the example shown in FIG. 3 is provided in the gate-sided driver circuit 108, the third switching transistor 146 may be provided in each of the pixel circuits. Alternatively, similar to the second switching transistor 144, the third switching transistor 146 may be shared between the plurality of adjacent pixels 104.

[2-2. Cross-Sectional Structure]

Figure 4:
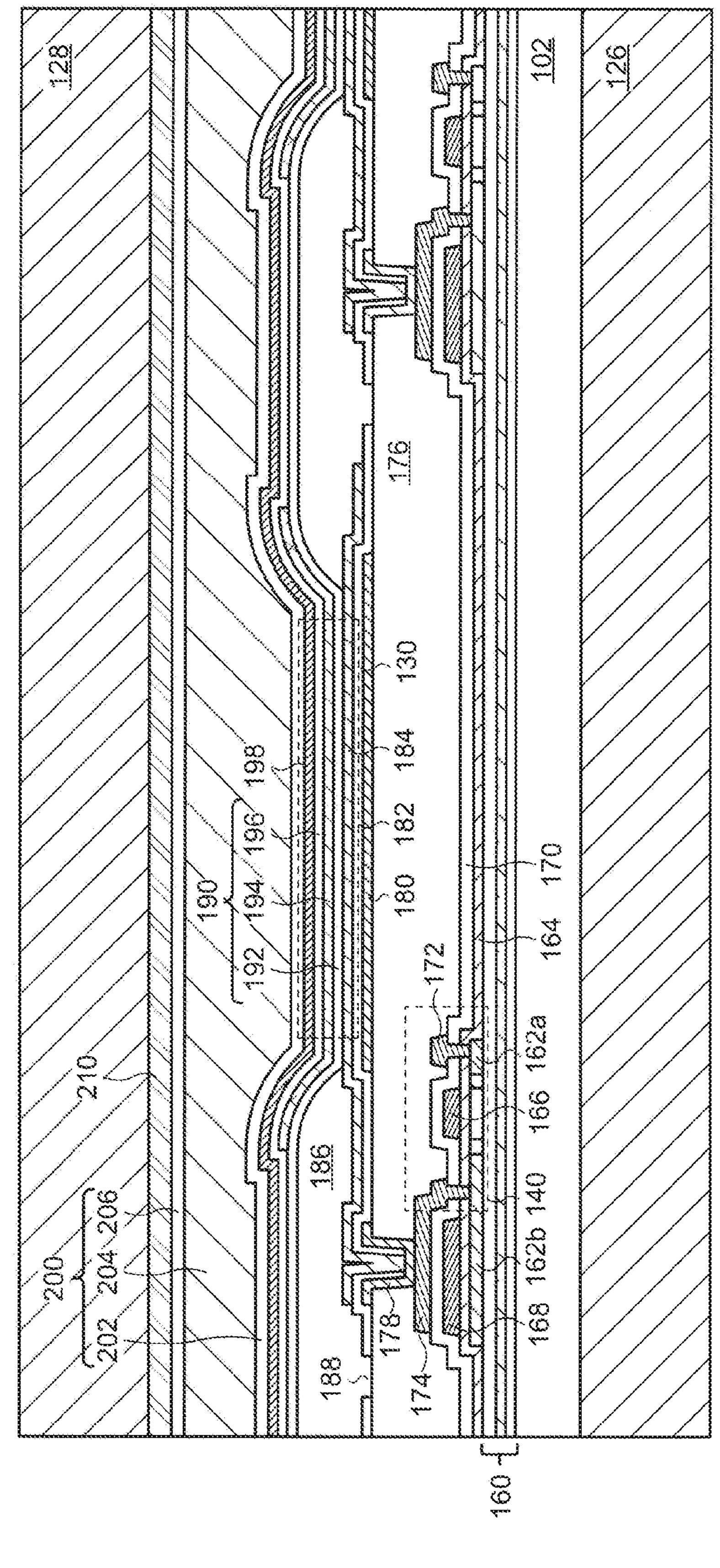
FIG. 4 is a schematic cross-sectional view of the display device according to an embodiment.

The cross-sectional structure of the pixel 104 will be described with reference to the drawings. In FIG. 4, a cross-sectional view of the driving transistor 140, the storage capacitor 150, the additional capacitor 152, the light-emitting element 130 in the pixel circuit of the two adjacent pixels 104 formed on the substrate 102 is shown.

The elements contained in the pixel circuit are provided on the substrate 102 via an undercoat 160. The driving transistor 140 includes a semiconductor film 162, a gate insulating film 164, a gate electrode 166, a drain electrode 172, and a source electrode 174. The gate electrode 166 is disposed to intersect at least a part of the semiconductor film 162 via the gate insulating film 164 and a channel is formed in a region where the semiconductor film 162 and the gate electrode 166 overlaps. The semiconductor film 162 also includes a drain region **162*a* and a source region 162*b*** that sandwich the channels.

Through the gate insulating film 164, a capacitor electrode 168 which is provided in the same layer as the gate electrode 166 is provided to overlap the source region 162*b*. An interlayer insulating film 170 is provided over the gate electrode 166 and the capacitor electrode 168. An opening reaching the drain region 162*a* and the source region 162*b* is formed in the interlayer insulating film 170 and the gate insulating film 164, and the drain electrode 172 and the source electrode 174 are disposed to cover the opening. A part of the source electrode 174 overlaps a part of the source region 162*b* and the capacitor electrode 168 via the interlayer insulating film 170, and the storage capacitor 150 is formed by a part of the source region 162*b*, the gate insulating film 164, the capacitor electrode 168, the interlayer insulating film 170, and the source electrode 174.

A planarizing film 176 is further provided over the driving transistor 140 and the storage capacitor 150. The planarizing film 176 has an opening that reaches the source electrode 174, and a connection electrode 178 which covers the opening and a portion of the upper surface of the planarizing film 176 is provided in contact with the source electrode 174. An additional capacitor electrode 180 is provided on the planarizing film 176. The connection electrode 178 and the additional capacitor electrode 180 can be formed simultaneously and can exist in the same layer. A capacitor insulating film 182 is formed to cover the connection electrode 178 and the additional capacitor electrode 180. The capacitor insulating film 182 does not cover a portion of the connection electrode 178 at the opening of the planarizing film 176 and exposes an upper surface of the connection electrode 178. Thus, electrical connections between the pixel electrode 184 and the source electrode 174 can be achieved via the connection electrode 178. An opening 188 can be provided in the capacitor insulating film 182 for allowing contact between a partition 186 on the connection electrode 178 and the planarizing film 176 provided. Impurities in the planarizing film 176 can be removed through the opening 188, so that the reliability of the light-emitting element 130 can be improved. Also, forming the connection electrode 178 and the opening 188 is optional.

The pixel electrode 184 is provided on the capacitor insulating film 182 to cover the connection electrode 178 and the additional capacitor electrode 180. The capacitor insulating film 182 is sandwiched by the additional capacitor electrode 180 and the pixel electrode 184, and the additional capacitor 152 is formed by this structure. The pixel electrode 184 is shared by the additional capacitor 152 and the light-emitting element 130.

The partition 186 is provided over the pixel electrode 184 to cover an end of the pixel electrode 184. An EL layer 190 and a counter electrode 198 over the EL layer 190 are provided to cover the pixel electrode 184 and the partition 186. The light-emitting element 130 consists of the pixel electrode 184, the EL layer 190 and the counter electrode 198.

The EL layer 190 may include a plurality of layers and may be formed by combining a variety of functional layers, for example, a carrier injection layer, a carrier transport layer, a light-emitting layer, a carrier blocking layer, an exciton block layer, and the like. The structure of the EL layer 190 may be the same between all the pixels 104 or may form be formed so that a part of the structure is different between the adjacent pixels 104. In FIG. 4, a hole transport layer 192, a light-emitting layer 194, and an electron transport layer 196 are shown as exemplary functional layers.

A protective film (hereinafter, passivation film) 200 for protecting the light-emitting element 130 is disposed on the light-emitting element 130. Although the structure of the passivation film 200 can be arbitrarily selected, a laminated structure including a first layer 202 containing an inorganic compound, a second layer 204 containing an organic compound, and a third layer 206 containing the inorganic compound can be applied as shown in FIG. 4.

A film 210 containing a resin (hereinafter, resin film) is provided on the passivation film 200. The display device 100 further has support films 126 and 128 to sandwich the structure from the substrate 102 to the resin film 210 and is provided with appropriate physical strength by the support films 126 and 128. The support films 126 and 128 are fixed to the substrate 102 and the resin film 210, respectively, by adhesive layers (not shown).

Although the detail will be described later, the undercoat 160, the gate insulating film 164, the interlayer insulating film 170, the capacitor insulating film 182, the first layer 202, and the third layer 206 are insulating films and include films containing silicon-containing inorganic compound such as silicon nitride, silicon oxide, silicon nitride oxide, or silicon oxynitride. In each of these insulating films, the films containing silicon-containing inorganic compound may be laminated. Therefore, these insulating films include the inorganic compound containing silicon as the main constituent element.

[3. Terminals and Wirings]

Figure 5:
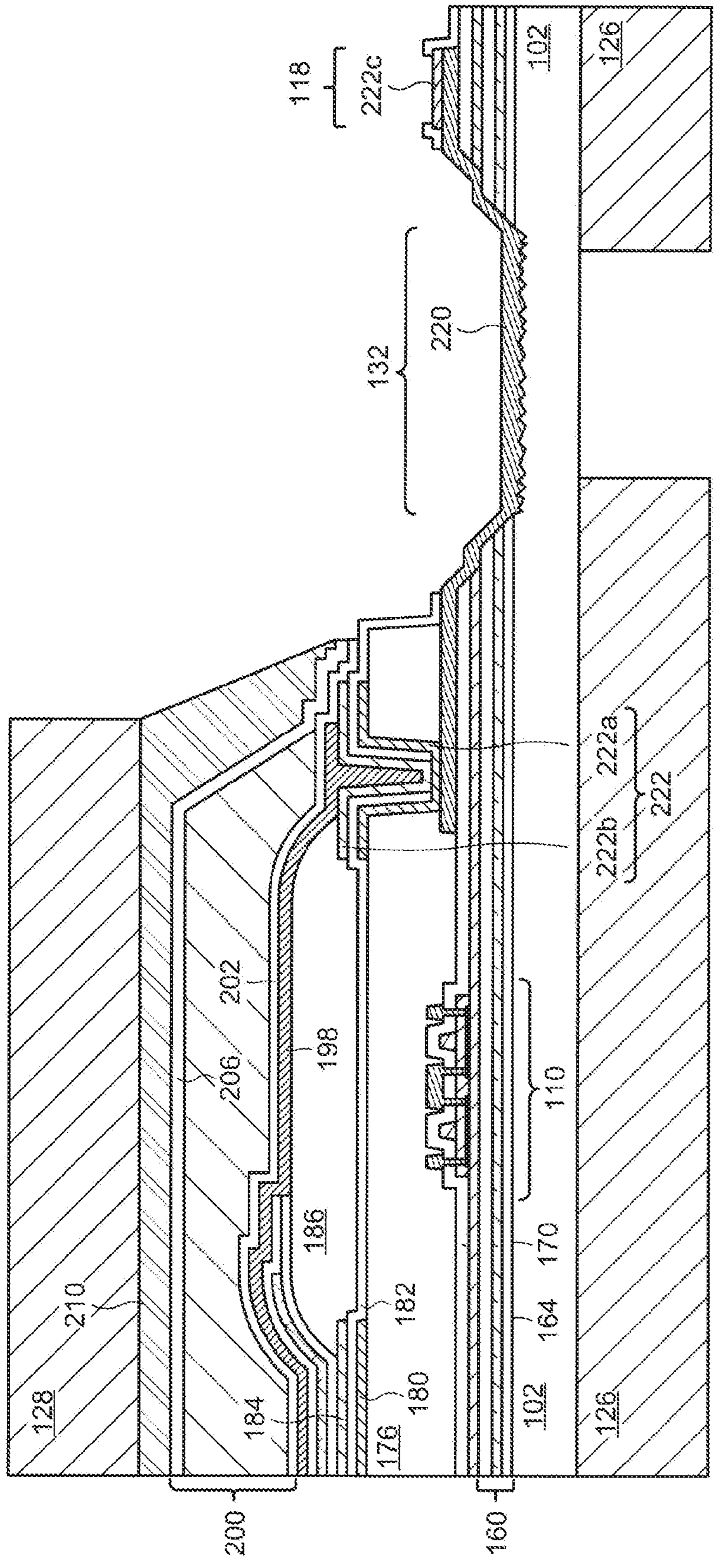
FIG. 5 is a schematic cross-sectional view of the display device according to an embodiment.

An example of a cross-sectional structure centered on a region from the end of the display region 106 (the lower part of the display region 106 in FIG. 1) to the power supply terminals 118 and 120 and the video signal terminal 116 is schematically shown in FIG. 5. Here, a cross section of a part of the display region 106, the source side driver circuit 110, the power supply terminal 118, and the wiring 220 for electrically connecting the display region 106 and the power supply terminal 118 is shown.

As shown in FIG. 5, the support film 126 is partially removed and divided into two portions, and the lower surface of the substrate 102 is exposed between the divided portions. The portion from which the support film 126 is removed has high flexibility and the display device 100 can be folded using this portion as shown in FIG. 2.

Semiconductor elements such as a transistor are provided in the source driver circuit 110, and various circuits such as analog switches are formed by the semiconductor elements. The counter electrode 198 extends from the display region 106 toward the end of the substrate 102, and is electrically connected to the wiring 220 at the opening provided in the planarizing film 176. More specifically, the wiring 220 is provided between the interlayer insulating film 170 and the planarizing film 176, that is, provided as the same layers as the source electrode 174 and the drain electrode 172 in the pixel 104. The planarizing film 176 has an opening reaching the wiring 220 between the source-sided driver circuit 110 and the power supply terminal 118, and a contact electrode 222 including a first contact electrode 222*a* and a second contact electrode 222*b* on the first contact electrode is provided to cover the opening. The counter electrode 198 is electrically connected to the wiring 220 via the second contact electrode 222*b* and the first contact electrode 222*a*. The wiring 220 forms the power supply terminal 118 near the end of the substrate 102. The surface of the power supply terminal 118 is covered by a protective electrode 222*c* present in the same layer as the first contact electrode 222*a*.

[4. The Unevenness of the Exposed Surface]

Figure 6:
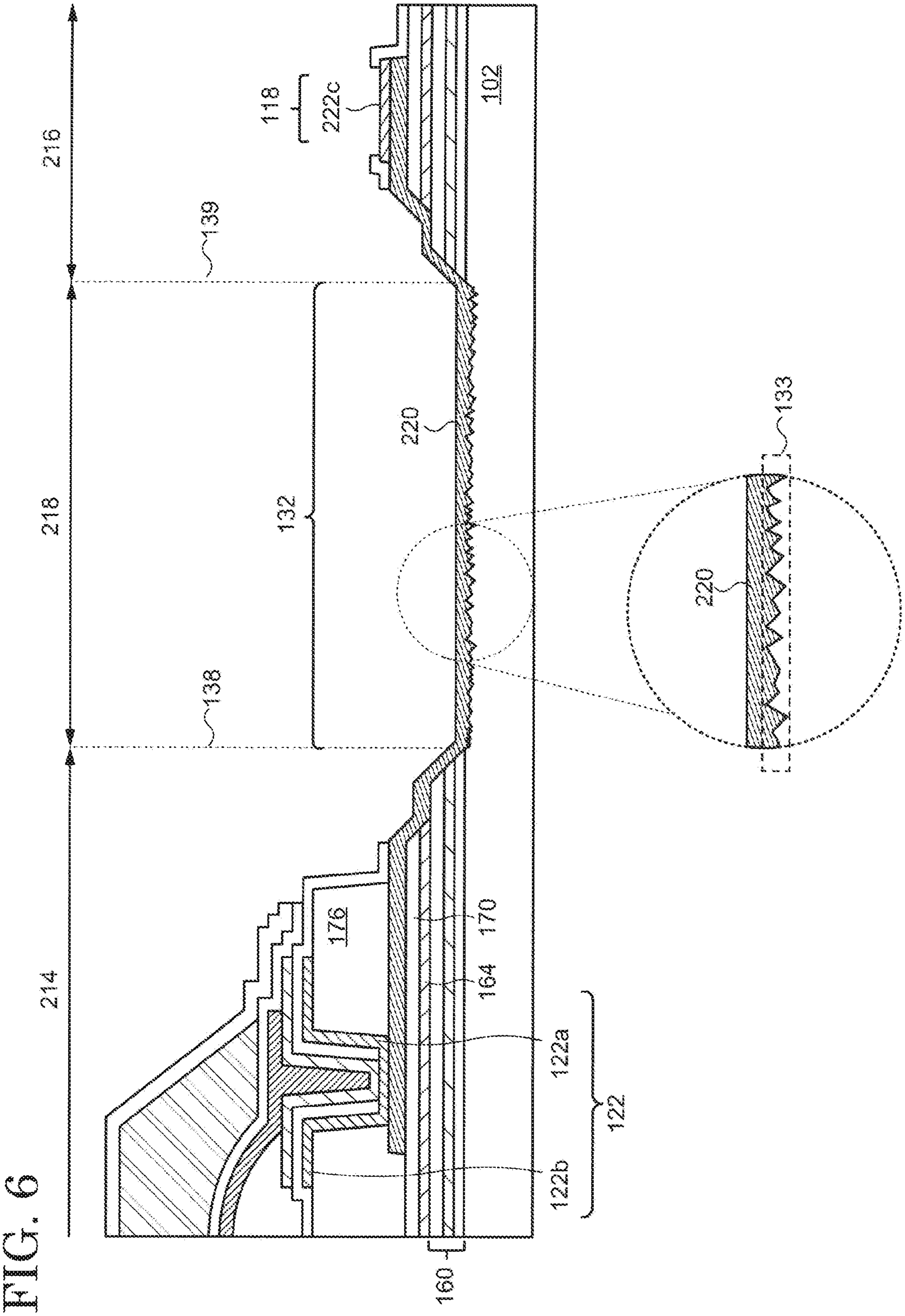
FIG. 6 is a schematic cross-sectional view of the display device according to an embodiment.

An enlarged view of FIG. 5 about the wiring 220 is shown in FIG. 6. As shown in FIG. 6, the undercoat 160 is partially removed and divided into two portions to form an exposed surface 132 exposed from the undercoat 160 over the substrate 102. Hereinafter, a region where the substrate 102 is exposed from the undercoat 160 is referred to as a third region 218, and regions where the undercoat 160 exists are referred to as a first region 214 and a second region 216. The display region 106, the source-sided driver circuit 110, and the contact electrode 222 are positioned in the first region 214, and the various terminals including the power supply terminal 118 are positioned in the second region 216.

The exposed surface 132 of the substrate 102 has a larger surface roughness than the first region 214 and the second region 216 of the substrate 102. That is, the exposed surface 132 of the substrate 102 has an unevenness 133, which is larger than the unevenness of the substrate 102 in the first region 214 and the second region 216. The pattern of the unevenness 133 may be continuous but may be discontinuous. When the size of the unevenness 133 is defined as the distance between the peak line and the valley bottom line, the size of the unevenness 133 may be 20 nm to 200 nm, preferably 50 nm to 100 nm. That is, the maximum height of the surface roughness at the exposed surface 132 of the substrate 102 may be 20 nm to 200 nm, preferably 50 nm to 100 nm. Although the size of the unevenness 133 may be constant over the entire exposed surface 132, only the unevenness 133 of the specific portion of the exposed surface 132 may be large or small. For example, the size of a part of the unevenness 133 in contact with the wiring 220 of the exposed surface 132 may be larger than the size of a part of the unevenness 133 not in contact with the wiring 220 of the exposed surface 132. The unevenness 133 may be formed when the undercoat 160 is removed by etching as described later. For the etching, wet etching or dry etching can be used, and wet etching and dry etching may be used in combination. The etching conditions (etching gas, etchant, etching time, or temperature, etc.) are set as appropriately. For example, dry etching using a mixed gas of carbon tetrafluoride ($CF_4$) and oxygen ($O_2$) as an etching gas can be used. Further, the unevenness 133 may be formed by a photolithographic method for the exposed surface 132 from which the undercoat 160 is removed. If a photolithographic method using a halftone mask, the continuous unevenness 133 is formed.

Figure 7:
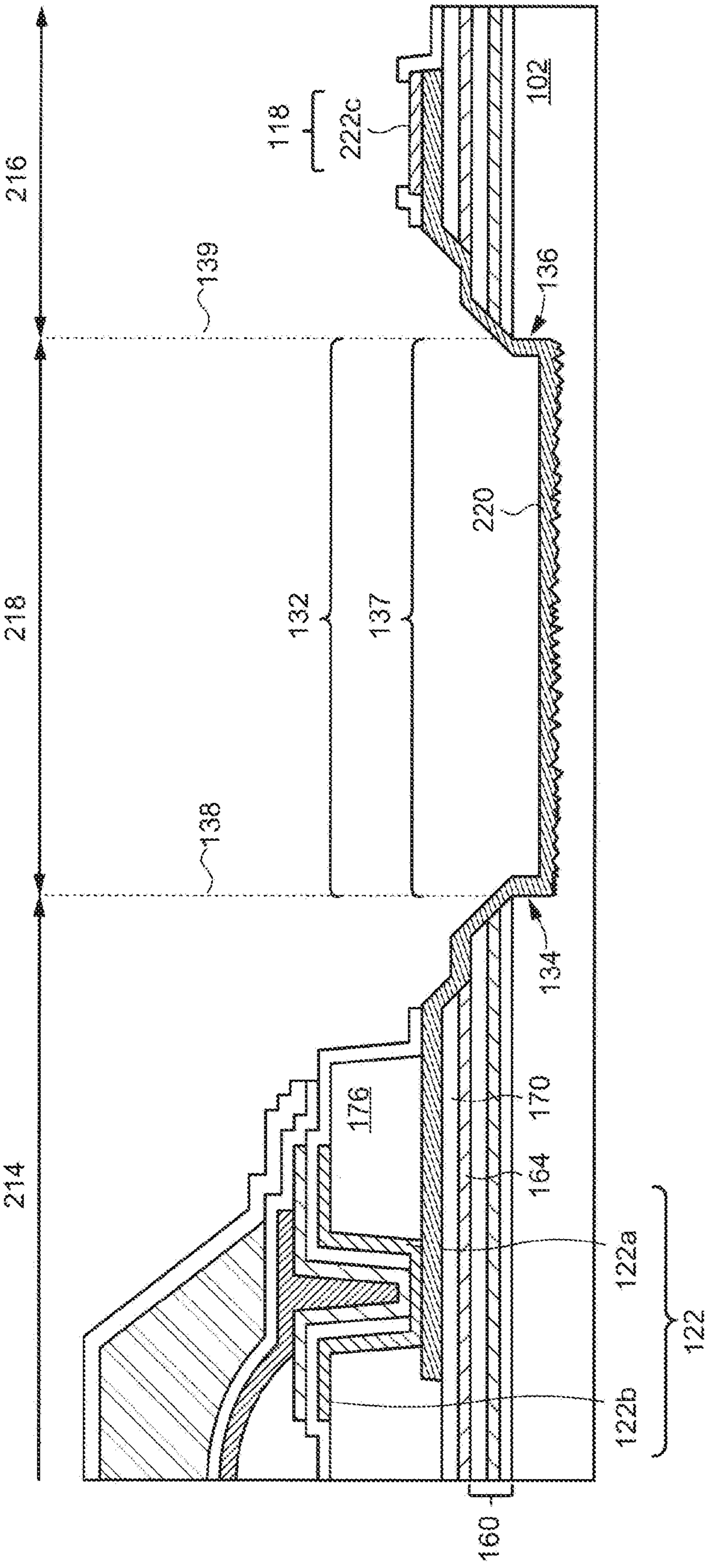
FIG. 7 is a schematic cross-sectional view of the display device according to an embodiment.

Although the thickness of the substrate 102 in the third region 218 is the same as the thickness of the substrate in the other regions, the thickness of the substrate 102 in the other region 218, as shown in FIG. 7, may be smaller than the thickness of the substrate in the other region to provide a step. That is, the substrate 102 is constituted by sidewalls facing each other (a first sidewall 134 and a second sidewall 136), and an upper surface of the substrate 102 between the first sidewall 134 and the second sidewall 136 and it may have a groove 137 overlapping the third region 218. However, this difference is preferably as small as possible. That is, the first sidewall 134 and the second sidewall 136 are preferably as small as possible.

Returning to FIG. 6, the description will be continued. Although the undercoat 160, the gate insulating film 164, the interlayer insulating film 170, and the planarizing film 176 are disposed on the substrate 102, these insulating films are not provided in the third region 218 because they are removed in the third region 218. The side surfaces of the gate insulating film 164 and the interlayer insulating film 170 may overlap the upper surface of the undercoat 160 as shown in FIG. 6, or may be on the same plane as the side surface of the undercoat 160, although not shown.

The wiring 220 is formed on the unevenness 133 of the exposed surface 132 of the substrate 102 in the third region 218, and is in contact with the substrate 102.

The wiring 220 is also in contact with the side surface of the undercoat 160. Here, the boundary between the third region 218 and the first region is referred to as a first boundary 138, and the boundary between the third region 218 and the second region is referred to as a second boundary 139. When the side surface of the gate insulating film 164 or the interlayer insulating film 170 overlaps the upper surface of the undercoat 160, the wiring 220 is in contact with the upper surface of the undercoat 160, the side surface of the gate insulating film, and the side surface and the upper surface of the interlayer insulating film 170 between the first boundary 138 and the display region 106 and between the second boundary 139 and the power supply terminal 118.

Figure 8A:
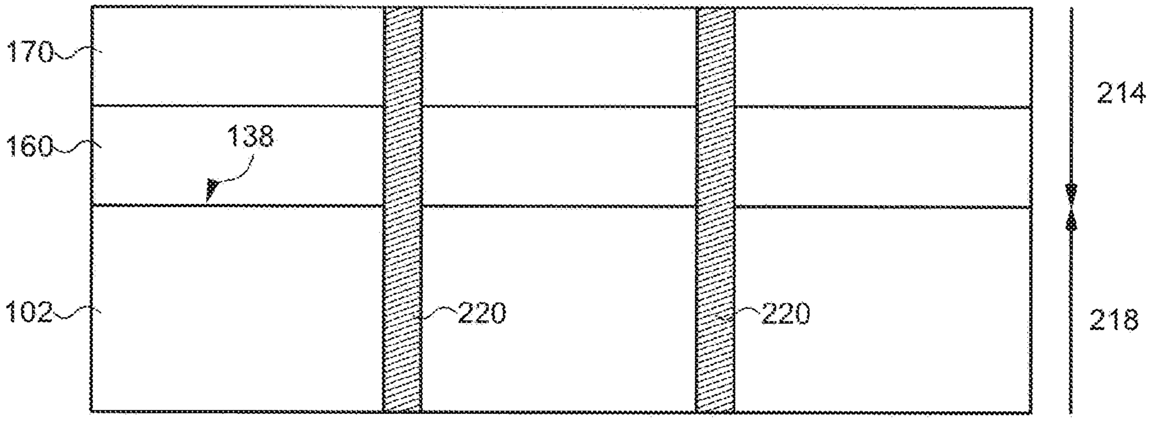
FIG. 8A is a schematic upper surface diagram of the display device according to an embodiment.
Figure 8B:
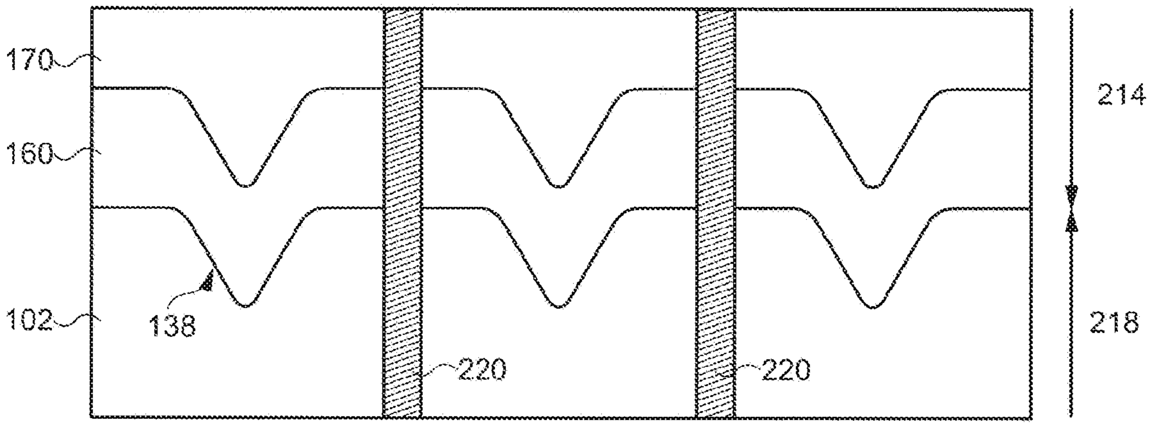
FIG. 8B is a schematic upper surface diagram of the display device according to an embodiment.

A schematic upper surface diagram of the first boundary 138 and its vicinity is shown in FIG. 8A and FIG. 8B. Here, the layouts of the undercoat 160, the interlayer insulating film 170, and the wiring 220 are shown.

In FIG. 8A, the side surface of the undercoat 160 and the side surface of the interlayer insulating film 170 are formed to be parallel to the short side of the substrate 102, but these may have curves in a plane parallel to the upper surface of the substrate 102. In other words, in the top view, they may have a curved shape. For example, as shown in FIG. 8B, the side surface of the undercoat 160 and the side surface of the interlayer insulating film 170 may have a curved shape between the adjacent wiring 220 in a plane parallel to the upper surface of the substrate 102, and may have a straight line in a region overlapping the wiring 220. By forming such shapes, even if the etching residue of the wiring 220 adheres to the side surface of the undercoat 160 and the side surface of the interlayer insulating film 170, the distance between the side surface of the undercoat 160 and the side surface of the interlayer insulating film 170 between the wiring 220 is increased. Therefore, it is possible to reduce the probability of shorting between the wiring 220.

Figure 9:
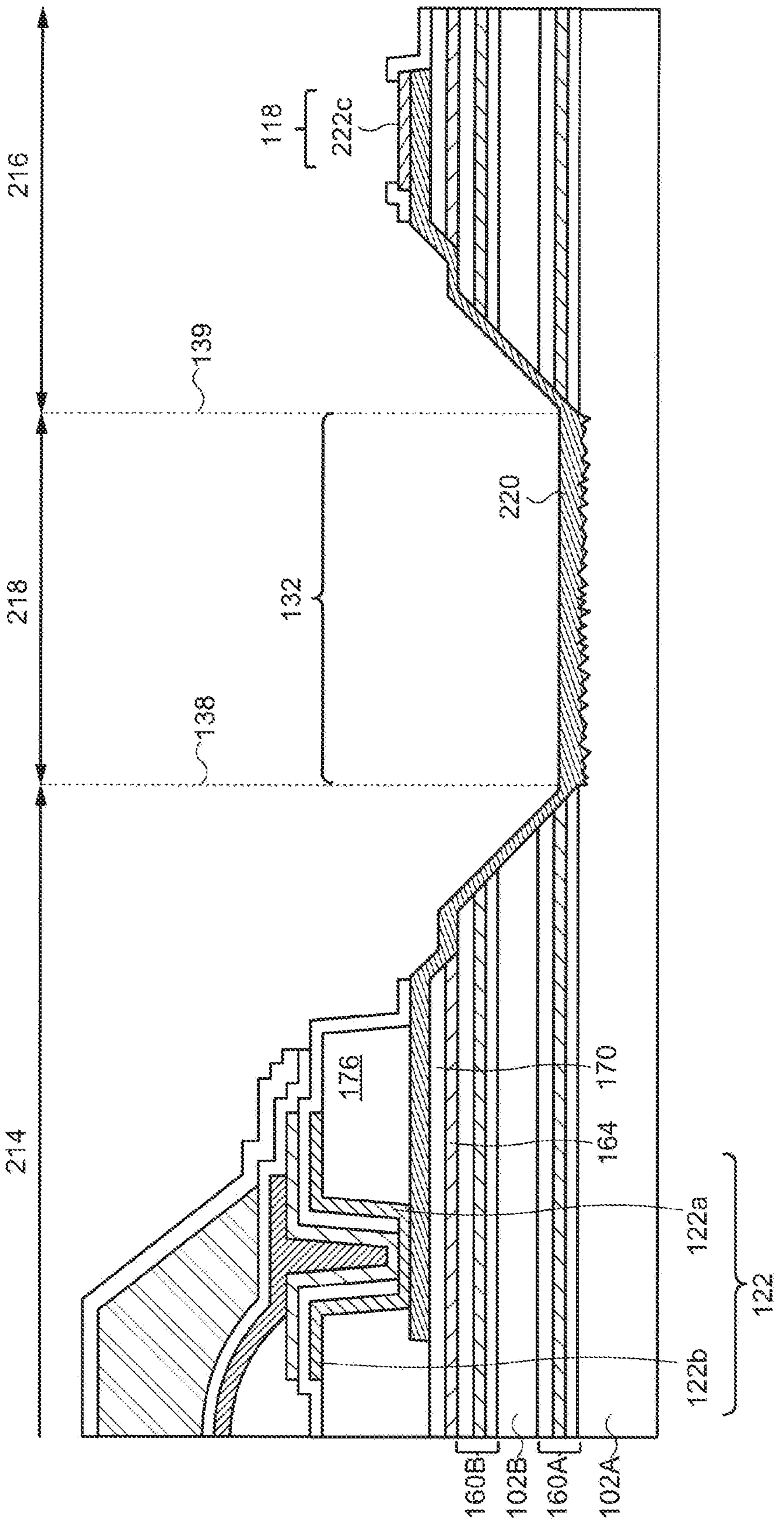
FIG. 9 is a schematic cross-sectional view of the display device according to an embodiment.

In the above, the display device 100 in which the undercoat 160 is positioned on the substrate 102 in the first region 214 and the second region 216 of the substrate 102, and the wiring 220 is in contact with the substrate 102 in the third region 218 has been described. The display device 100, as shown in FIG. 9, in the first region 214 and the second region 216 of a first substrate 102A, a first undercoat 160A may be positioned on the first substrate 102A, a second substrate 102B may be positioned on the first undercoat 160A, and further the wiring 220 may be in contact with the substrate 102 in the third region 218. In this case, the wiring 220 contacts the first undercoat 160A, the second substrate 102B, and the side surface of a second undercoat 160B. When the side surface of the gate insulating film 164 or the interlayer insulating film 170 overlaps the upper surface of the second undercoat 160B, the wiring 220 is in contact with the upper surface of the second undercoat 160B, the side surface of the gate insulating film 164, and the side surface and the upper surface of the interlayer insulating film 170 between the first boundary 138 and the display region 106, and between the second boundary 139 and the power supply terminal 118.

As described above, the third region 218 in which the undercoat 160, the gate insulating film 164 and the interlayer insulating film 170 are removed is provided between the display region 106 of the display device 100 and the terminals (the power supply terminal 118 and 120, and the video signal terminal 116). Therefore, the third region 218 has higher flexibility than other regions, and the display device 100 can be easily bent in this region.

However, when these insulating films are removed, in the third region 218, which is a region that can be bent, a problem occurs in the adhesion between the substrate 102 and the wiring, and the wiring may be peeled off from the substrate or may be disconnected when the wiring is bent.

In contrast, the display device 100 described in this embodiment, the unevenness 133 is formed on the exposed surface 132 where the insulating film on the substrate 102 is removed, and the wiring 220 is disposed thereon. Accordingly, the anchoring effect of the unevenness 133 improves the adhesion between the substrate 102 and wiring, and it is possible to suppress wiring from peeling off the substrate or disconnection. Therefore, by applying this embodiment, the display device 100 can have high reliability.

Second Embodiment

In the first embodiment, the display device 100 in which the exposed surface 132 where the insulating film is removed on the substrate 102 has the unevenness 133 and the wiring 220 is disposed thereon have been described. In this embodiment a modified example in which a prepreg 300 that is a sheet-like member in which fibers are impregnated with a resin is used as a substrate will be described.

Figure 10:
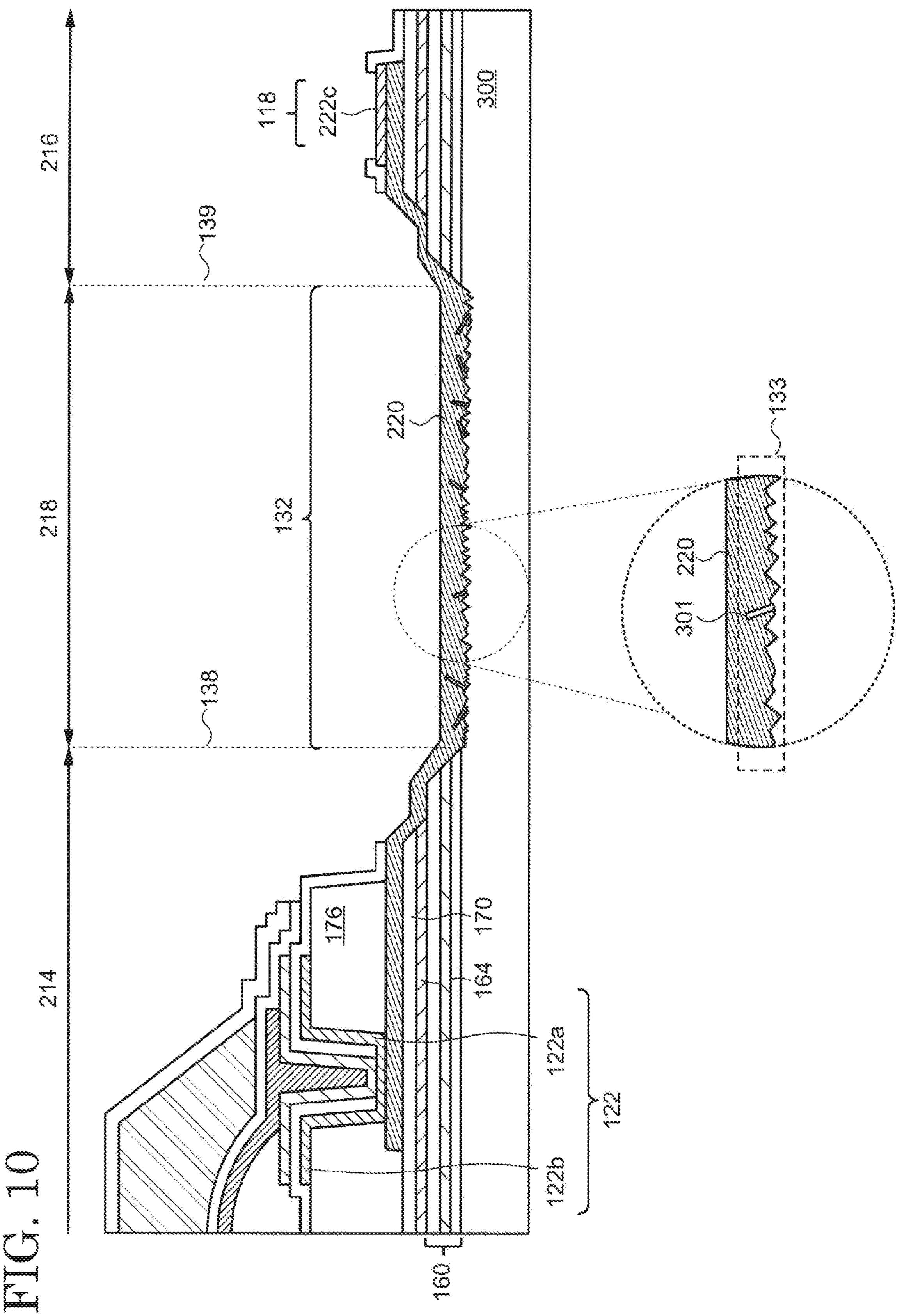
FIG. 10 is a schematic cross-sectional view of the display device according to an embodiment.

For example, as shown in FIG. 10, the display device 100 may have the prepreg 300 as its substrate 102.

High-strength fibers of an organic compound or an inorganic compound may be used for the fibers of the prepreg 300. The high-strength fibers specifically refers to fibers with a high tensile modulus or Young's modulus, and typical examples include polyvinyl alcohol-based fibers, polyester-based fibers, polyamide-based fibers, polyethylene-based fibers, aramid-based fibers, poly-para-phenylenebenzobisoxazole fibers, glass fibers, or carbon fibers. The glass fibers include E glass, S glass, D glass, Q glass or the like. These may be used in the state of a woven fabric or a nonwoven fabric, and a structure in which the fiber is impregnated with an organic resin and the organic resin is cured may be used as the substrate 102. When a structure made of fibers and resins is used as the substrate 102, reliability against breakage due to bending or local pressing is improved.

As the resin impregnated into the fibers of the prepreg 300, for example, an epoxy-based resin, phenolic resin, a polyimide-based resin, acrylic resin, or the like can be used.

Similarly to the substrate 102 in the first embodiment, the prepreg 300 has the third region 218 having the exposed surface 132 exposed from the undercoat 160, the first region where the undercoat 160 exists, the display region 106, the source-sided driver circuit 110, and the contact electrode 222 are located, and the second region 216 in which the various terminals including the power supply terminal 118 are located.

Similarly to the substrate 102 in the first embodiment, the exposed surface 132 of the prepreg 300 has a larger surface roughness than the first region 214 and the second region 216 of the prepreg 300. That is, the exposed surface 132 of the prepreg 300 has the unevenness 133, and the unevenness 133 is larger than the unevenness of the prepreg 300 in the first region 214 and the second region 216.

The prepreg 300 may expose a fiber 301 that is a part of the fibers constituting the prepreg 300 in the exposed surface 132. In this case, although the unevenness 133 may be formed in the exposed surface 132 by the fiber 301 exposed from the prepreg 300, the unevenness 133 may be formed when the undercoat 160 is removed by etching, or may be formed by a photolithographic method in the exposed surface 132 from which the undercoat 160 is removed, similar to the substrate 102 in the first embodiment.

The wiring 220 is formed on the unevenness 133 of the exposed surface 132 in the third region 218 of the prepreg 300 and is contact with the substrate 102.

Figure 11:
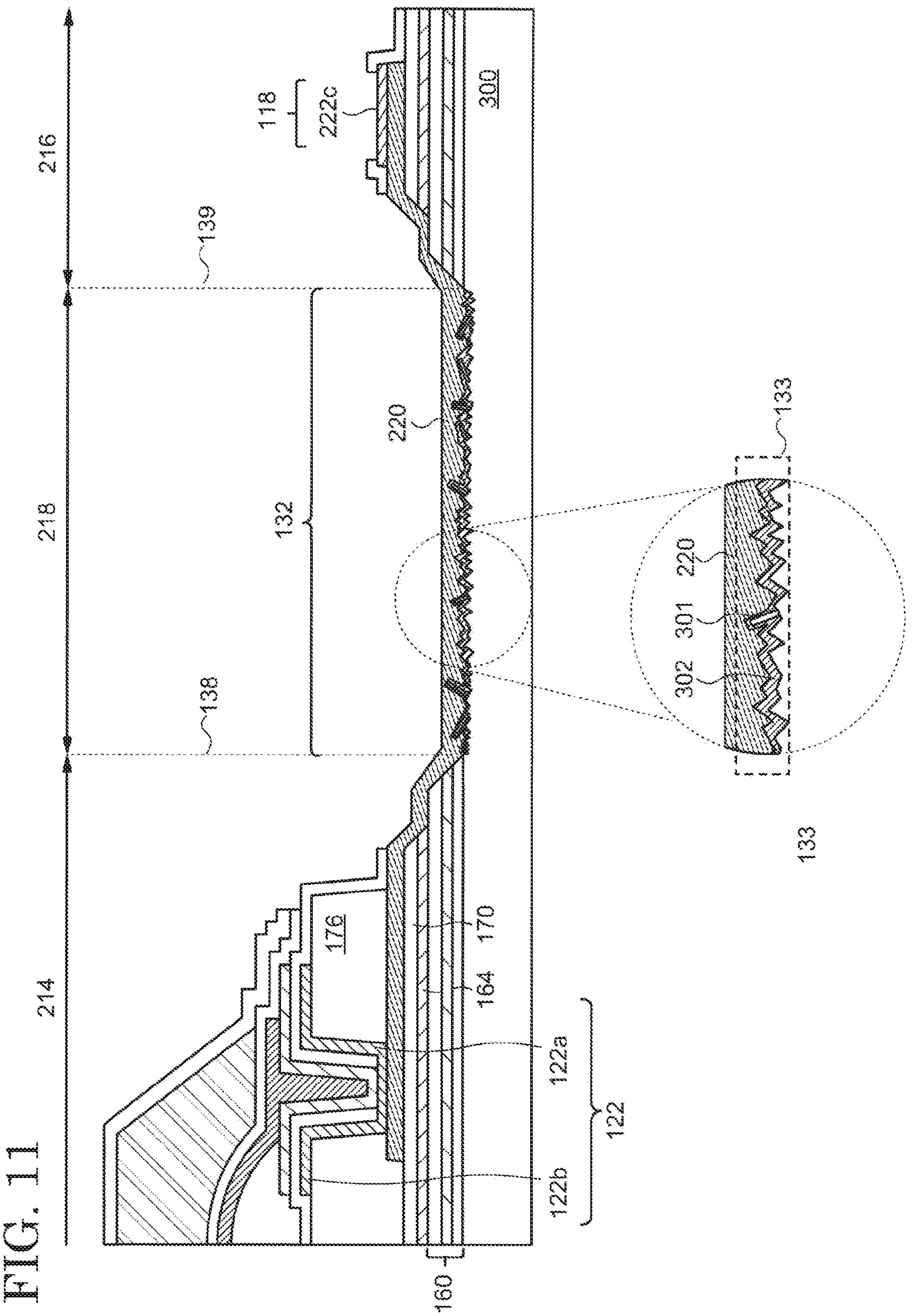
FIG. 11 is a schematic cross-sectional view of the display device according to an embodiment.

The fiber 301 is preferably not positioned over the upper end of the wiring 220 because the fiber 301 over the upper end of the wiring 220 affects the manufacturing process of the display device 100. For example, if the distance from the lower end of the wiring 220 (the point in contact with the substrate 102) to the upper end of the wiring 220 is about 600 nm, the vertical distance from the upper end of the prepreg 300 to the upper end of the fiber 301 is 50 nm to 500 nm, preferably 100 nm to 300 nm. If necessary, as shown in FIG. 11, the exposed surface 132 of the prepreg 300 having an unevenness covered with a resin film 302, and the wiring is further formed on the unevenness 133 formed on the resin film 302 by the unevenness of the prepreg 300, and the wiring may be in contact with the resin film 302. In this case, the resin film 302 on the exposed surface 132 of the prepreg 300 has a larger surface roughness than the first region 214 and the second region 216 of the prepreg 300. That is, the resin film 302 on the exposed surface 132 of the prepreg 300 has the unevenness 133, and the unevenness 133 is larger than the unevenness of the prepreg 300 in the first region 214 and the second region 216.

Other configurations are the same as or similar to the first embodiment, the description and a description thereof will be omitted.

In this embodiment, the prepreg 300 is used as the substrate 102, and unevenness 133 such as a fiber 301 is provided on the exposed surface 132 which is a region where the insulating film is removed. When the resin film 302 is disposed, the unevenness 133 is provided in the resin film 302 by the unevenness of the prepreg 300 below the resin film 302. Then, since the wiring 220 is disposed on the exposed surface 132 or the resin film 302 having the unevenness 133, the anchoring effect due to the unevenness 133 occurs between the wiring 220 and the exposed surface 132 or the resin film 302. Accordingly, as in the first embodiment, by applying this embodiment, the adhesion between the substrate 102 and the wiring 220 can be improved, and it is possible to suppress wiring peeling off the substrate or disconnection. Therefore, by applying this embodiment, the display device 100 can have high reliability.

Third Embodiment

In this embodiment, a process for manufacturing of the display device 100 will be described. Here, using the display device 100 having the structure shown in FIG. 6 as an example, the manufacturing method thereof will be described with reference to FIG. 12A to FIG. 18. Each of FIG. 12A to FIG. 15B includes two views, the left side is a cross-sectional schematic view of the pixel 104 and the right side is a cross-sectional schematic view centered on the third region 218. Descriptions of the same contents as in the first embodiment may be omitted.

Figure 12A:
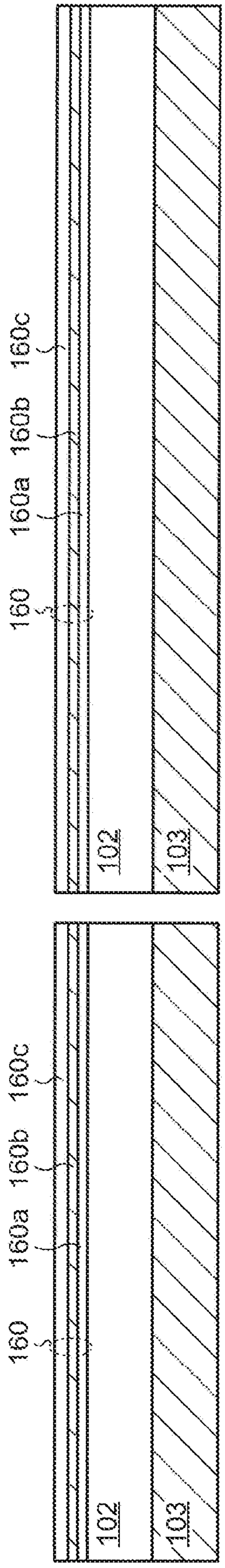
FIG. 12A is a schematic cross-sectional view illustrating a process for manufacturing the display device according to an embodiment.

As shown in FIG. 12A, first, the substrate 102 is formed on a support substrate 103. The support substrate 103 supports the various insulating films, conductive films, and a semiconductor film included in the display device 100 during the manufacturing process of the display device 100, and can include glass or quartz. The substrate 102 is a flexible substrate and includes polymers such as polyimides, polyamides, polycarbonates, and the like. The substrate 102 is provided on the support substrate 103 by a wet deposition method such as an inkjet method, a spin-coating method, a printing method, or a laminating method. When the display device 100 does not have flexibility, the support substrate 103 may be used as a substrate.

Then, the undercoat 160 is formed over the substrate 102 to have a single layer or a stacked structure. The undercoat 160 is formed on the entire surface of the substrate 102. Here, a stacked layer of a first layer 160*a* to a third layer 160*c* is shown as the undercoat 160. For example, silicon oxide film, a silicon nitride film, and a silicon oxide film can be used as the first layer 160*a* to the third layer 160*c*, respectively. In this case, the first layer 160*a* is provided for improving the adhesion to the substrate 102. The second layer 160*b* is provided as a block film for impurities such as water. The third layer 160*c* is provided as a block film for preventing diffusion of hydrogen atoms contained in the second layer 160*b*. Although not shown, a light-shielding film may be formed in a region where a transistor is formed before the formation of the undercoat 160. Here, the silicon oxide film is a film containing silicon and oxygen as the main component and silicon nitride films is a film containing silicon and nitrogen as the main component.

Figure 12B:
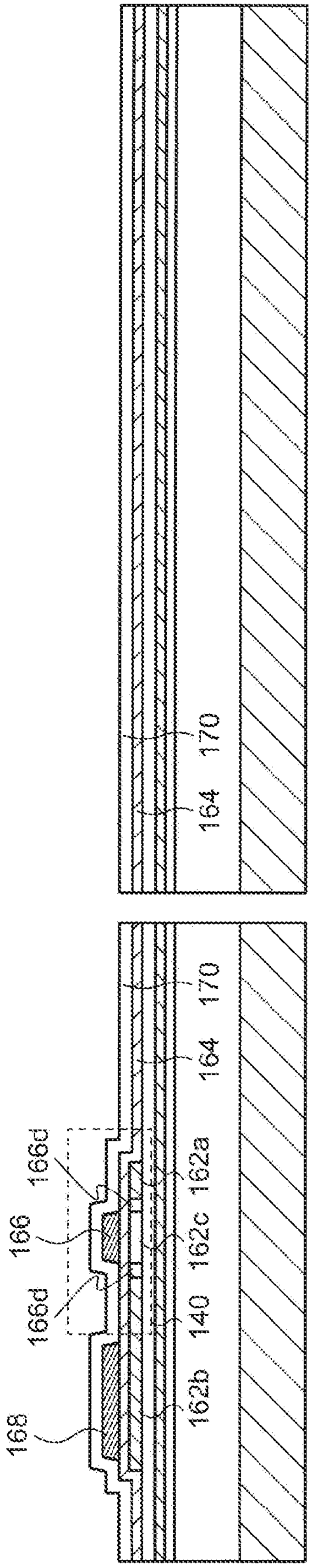
FIG. 12B is a schematic cross-sectional view illustrating a process for manufacturing the display device according to an embodiment.

Next, a transistor or the like in the pixel circuit is formed over the undercoat 160 (FIG. 12B). As an example, the formation of an n-channel driving transistor 140 with polysilicon as the semiconductor film 162 and the storage capacitor 150 are described. However, a p-channel type transistor may be formed at the same time. The semiconductor film 162, the gate insulating film 164, the gate electrode 166, and the capacitor electrode 168 are sequentially formed over the undercoat 160. The semiconductor film 168 includes a channel region 162*c* overlapping the gate electrode, a drain region 162*a*, and a source region 162*b*. In addition, the semiconductor film 168 has a structure in which a low-concentration impurity region 162*d* is provided between the channel region 162*c* and the drain region 162*a*, and between the channel region 162*c* and the source region 162*b*. The gate insulating film 164 includes a silicon-containing inorganic compound, such as a silicon oxide film is used. The gate electrode 166 and the capacitor electrode 168 are formed using a wiring (first wiring) including a metal selected from various metals or an alloy thereof, and the first wiring has a stacked structure of, for example, molybdenum and tungsten. The capacitor electrode 168 exists in the same layer as the gate electrode 166 and is used to form the storage capacitor 150 together with the gate insulating film 164 and the source region 162*b*.

The interlayer insulating film 170 is formed on the gate electrode 166 and the capacitor electrode 168 (FIG. 12B). The interlayer insulating film 170 is also formed from the first region 214 to the third region 218 and the second region 216. Although FIG. 12B shows the interlayer insulating film 170 as having a single layer structure, the interlayer insulating film 170 may be formed by stacking, for example, silicon oxide film and silicon nitride film.

Figure 13A:
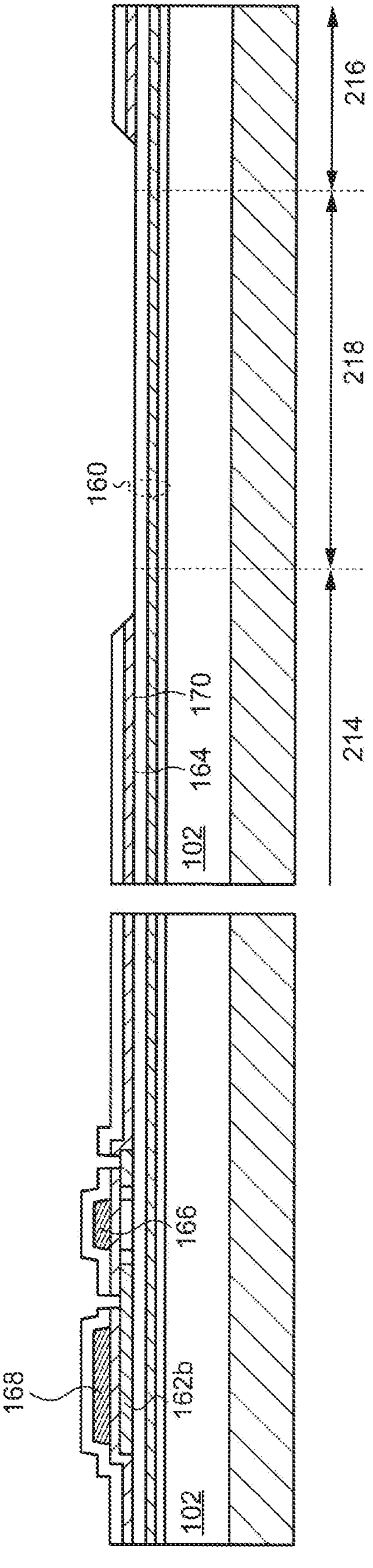
FIG. 13A is a schematic cross-sectional view illustrating a process for manufacturing the display device according to an embodiment.

Then, the patterning is performed to remove a portion of the interlayer insulating film 170 and the gate insulating film 164 and expose the undercoat 160 in the third region 218 (FIG. 13A). At this time, an opening for exposing the drain region 162*a* and the source region 162*b* is also formed at the same time.

Figure 13B:
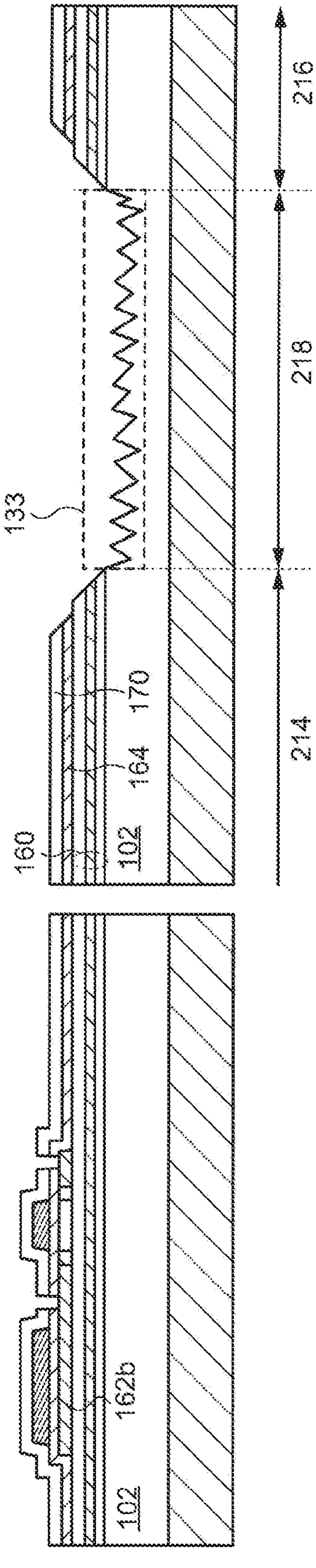
FIG. 13B is a schematic cross-sectional view illustrating a process for manufacturing the display device according to an embodiment.

Next, the third region 218 is covered with a resist mask (not shown) to remove the exposed undercoat 160 by etching. The etching condition is a condition under which the unevenness 133 is formed in the third region as shown in FIG. 13B, and may be appropriately adjusted. Here, for example, dry etching using a mixed gas of carbon tetrafluoride ($CF_4$) and oxygen ($O_2$) is used as an etching gas.

Although not shown, the opening for exposing the drain region 162*a* and the source region 162*b* may be formed, and the removal of the undercoat 160 and the formation of the unevenness 133 may be performed simultaneously.

Figure 14A:
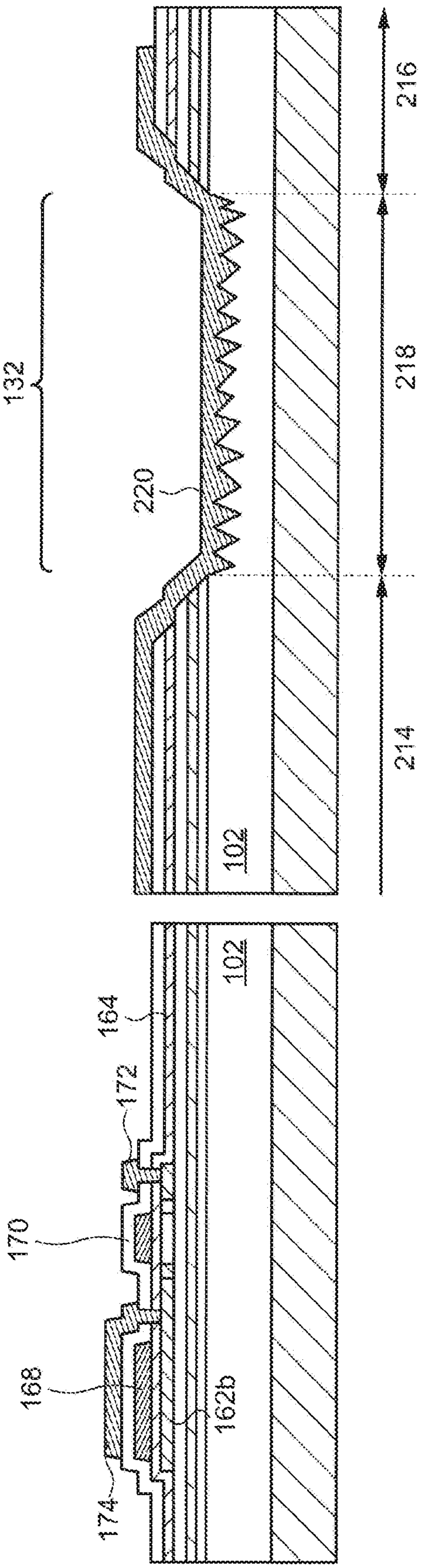
FIG. 14A is a schematic cross-sectional view illustrating a process for manufacturing the display device according to an embodiment.

Then, after the conductive layer is formed using the second wiring, etching is performed to form the drain electrode 172, the source electrode 174, and the wiring 220 (FIG. 14A). The second wiring can also be formed as a laminate of a plurality of metal layers, for example, a three-layer laminated structure of titanium/aluminum/titanium. By forming the wiring 220, the wiring 220 is contact with the unevenness 133 in the third region 218 of the substrate 102. At the same time, a portion of the source electrode 174 is positioned to overlap the capacitor electrode 168, and the storage capacitor 150 is formed using the source region 162*b*, the gate insulating film 164, the capacitor electrode 168, the interlayer insulating film 170, and a portion of the source electrode 174. The wiring 220 extends to the second region 216 and forms the power supply terminal 118 for connecting the FPC 114 later.

Figure 14B:
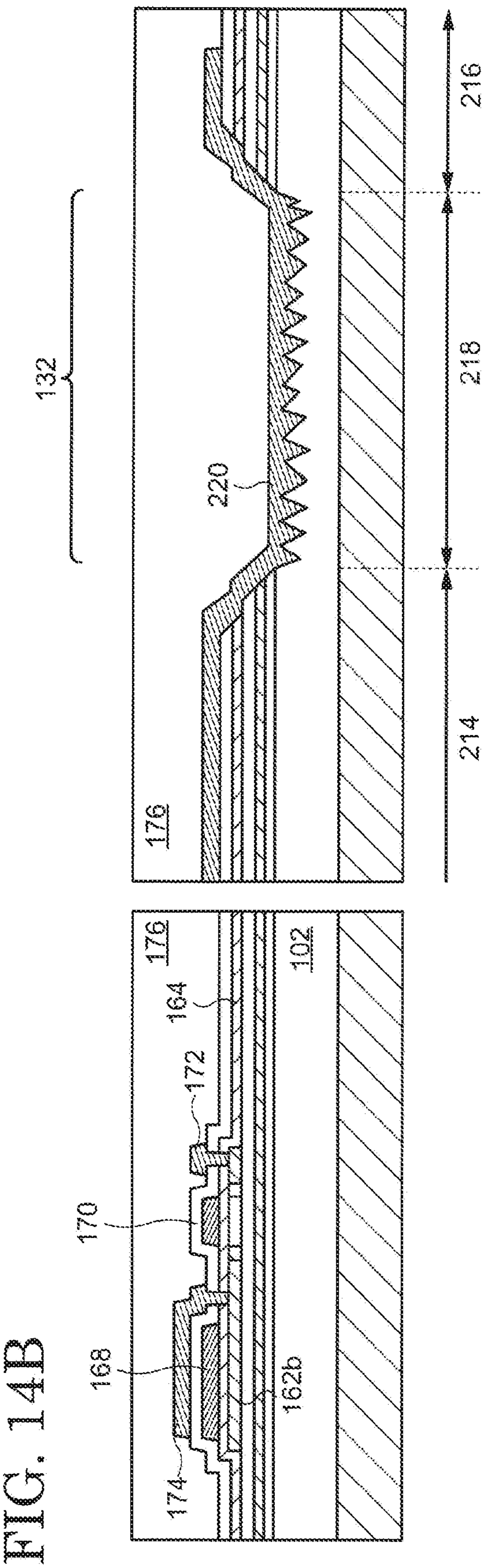
FIG. 14B is a schematic cross-sectional view illustrating a process for manufacturing the display device according to an embodiment.
Figure 15A:
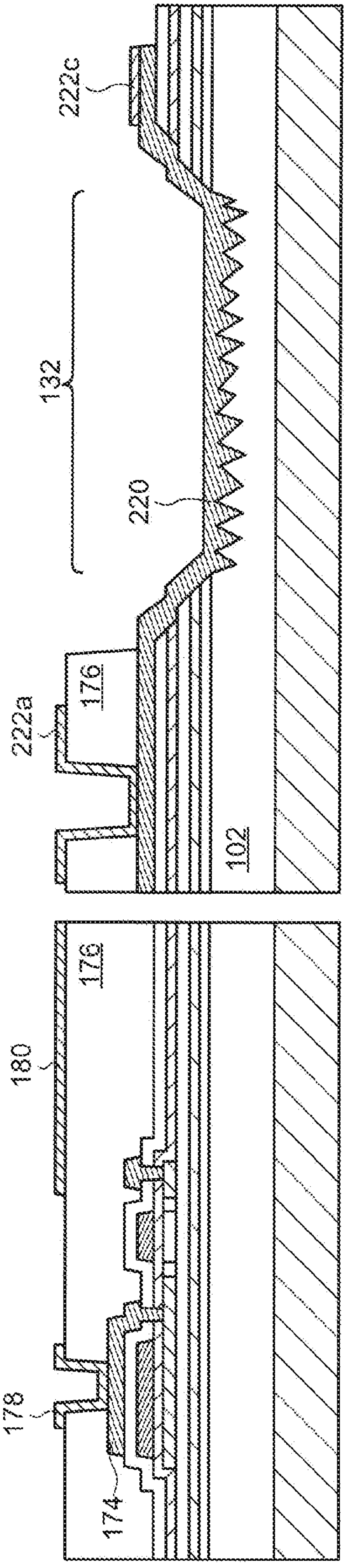
FIG. 15A is a schematic cross-sectional view illustrating a process for manufacturing the display device according to an embodiment.

Next, the planarizing film 176 is formed to cover the driving transistor 140, the storage capacitor 150, and the wiring 220 (FIG. 14B). Organic material such as a photosensitive acrylic resin is used as the planarizing film 176, thereby an insulating film having an excellent flatness can be provided. After the planarizing film 176 is formed on almost the entire surface of the substrate, a part of the planarizing film 176 is removed, and the connection between the source electrode 174 and the pixel electrode 184, the connection between the wiring 220 and the contact electrode 222, the formation of the power supply terminal 118, and the opening in the third region 218 to allow for high flexibility (FIG. 15A). Then, the source electrode 174 and the wiring 220 exposed by removing the planarizing film 176 are protected by using conductive oxides such as an indium-tin-oxide (ITO) and indium zinc oxide (IZO). That is, the connection electrode 178 which is connected to the source electrode 174 and the first contact electrode 222*a* and the protective electrode 222*c* which are connected to the wiring 220 are formed. By forming them, degradation of the source electrode 174 and the wiring 220 can be prevented in subsequent processes. At the same time, the additional capacitor electrode 180 is formed on the planarizing film 176 (FIG. 15A).

Figure 15B:
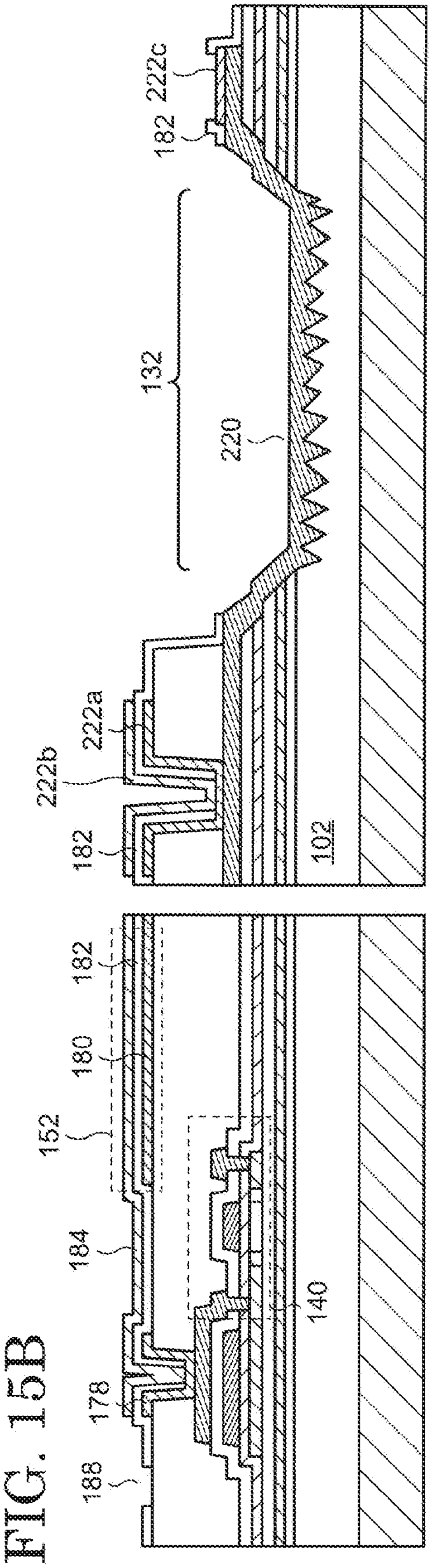
FIG. 15B is a schematic cross-sectional view illustrating a process for manufacturing the display device according to an embodiment.

Subsequently, the connection electrode 178, the first contact electrode 222*a*, and the capacitor insulating film 182 are formed to cover the protective electrode 222*c*. The capacitor insulating film 182 may include a silicon-containing inorganic compound, and typically, a silicon nitride film is used. After the capacitor insulating film 182 is also formed on almost the entire surface of the substrate, a part of the capacitor insulating film 182 is removed by patterning using etching so that the upper surfaces of the connection electrode 187 and the first contact electrode 222*a*, the surface excluding the end of the protection electrode 222*c*, and the wiring 220 are exposed (FIG. 15B). Thus, terminals such as the power supply terminal 118 are formed. At the same time, the opening 188 is formed.

Next, the pixel electrode 184 is formed (FIG. 15B). Although the configuration of the pixel electrode 184 is arbitrary, when used as a reflective electrode, for example, a three-layer stacked structure of IZO, silver, and IZO may be applied. The pixel electrode 184 is electrically connected to the connection electrode 178 and is provided to overlap the additional capacitor electrode 180. Accordingly, the pixel electrode 184 is electrically connected to the driving transistor 140, and the additional capacitor 152 which includes the pixel electrode 184, the capacitor insulating film 182, and the additional capacitor electrode 180 is formed. At the same time as the formation of the pixel electrode 184, the second contact electrode 222*b* is formed so as to overlap and be electrically connected to the first contact electrode 222*a*.

Figure 16:
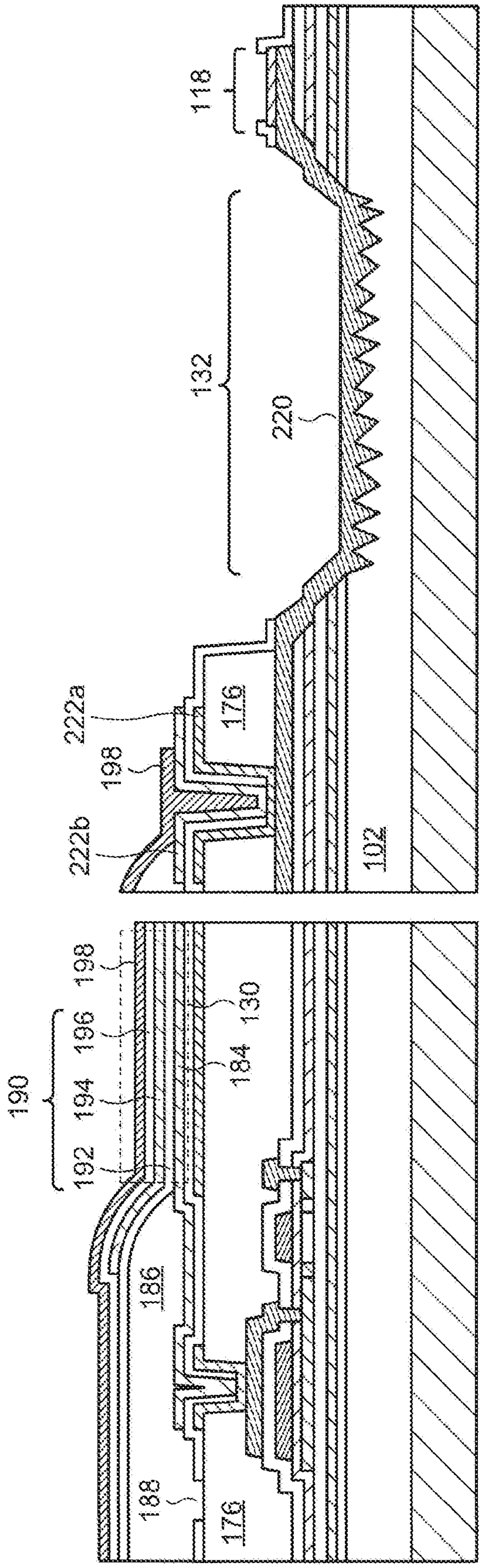
FIG. 16 is a schematic cross-sectional view illustrating a process for manufacturing the display device according to an embodiment.

After the pixel electrode 184 is formed, the partition (also referred to as a bank, or a rib) 186 is formed (FIG. 16). The partition 186 is formed using a photosensitive acrylic resin or the like, similar to the planarizing film 176. The partition 186 has an opening to expose the surface of the pixel electrode 184 as a light-emitting region, and the opening end preferably has a smooth tapered shape. If the opening end has a steep shape, poor coverage of the EL layer 190 formed later is caused. Here, the planarizing film 176 and the partition 186 are in contact with each other through the opening 188 provided in the capacitor insulating film 182 between them. Thus, impurities such as water or organic compounds which are desorbed from the planarizing film 176 can be released through the partition 186 by heat treatment after forming the partition 186.

After the partition 186 is formed, the EL-layer 190 is formed (FIG. 16). The functional layer included in the EL layer 190 can be formed by a vapor deposition method or a wet film deposition method. After the EL layer 190 is formed, the counter electrode 198 is formed. Here, since the light-emitting element 130 having so-called top-emission structure is formed, the counter electrode 198 is configured to transmit visible light. For example, the counter electrode 198 is formed by depositing an alloy of magnesium and silver with a thickness enough to transmit light emitted from the EL layer 190. The counter electrode 198 is formed to cover not only the display region 106 but also the contact electrode 222, and is electrically connected to the wiring 220 through the first contact electrode 222*a* and the second contact electrode 222*b*. Accordingly, PVSS provided from the power supply terminal 118 to the counter electrode 198.

Figure 17:
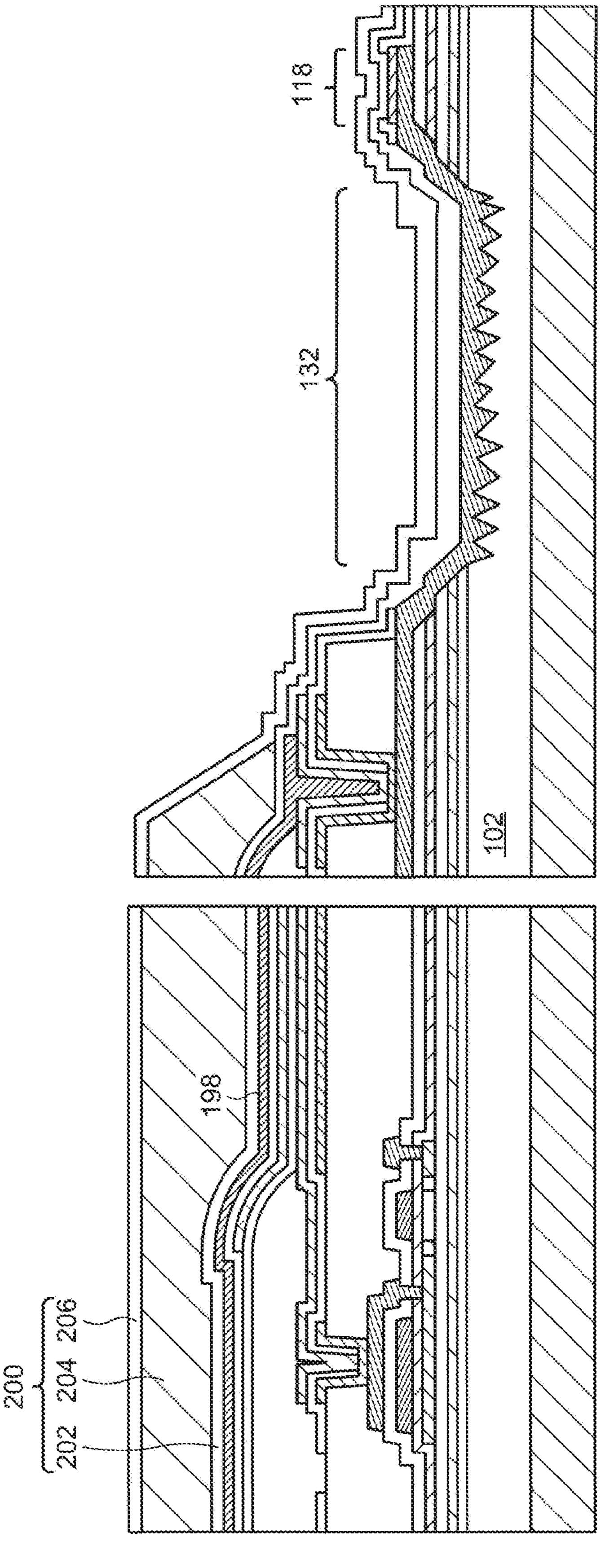
FIG. 17 is a schematic cross-sectional view illustrating a process of manufacturing the display device according to an embodiment.

After forming the counter electrode 198, the passivation film 200 is formed. One of the functions of the passivation film 200 is to prevent impurities such as water from entering the light-emitting element 130 from the outside. As shown in FIG. 17, the passivation film 200 may have a structure in which the first layer 202, the second layer 204, and the third layer 206 are stacked, and may be formed as, for example, silicon nitride films, an organic resin film, and silicon nitride films, respectively. A silicon oxide film or an amorphous silicon film may be further provided between the first layer 202 and the second layer 204 or between the second layer 204 and the third layer 206, for the purpose of adhesion improvement.

Figure 18:
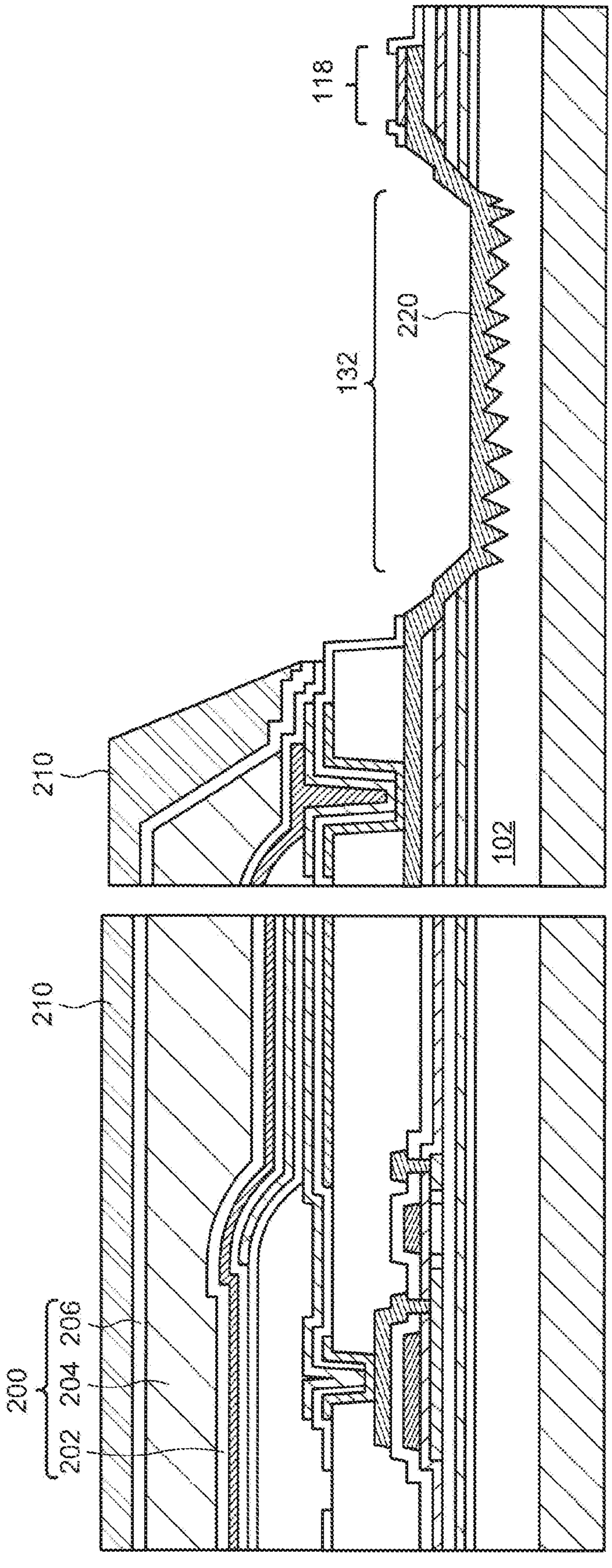
FIG. 18 is a schematic cross-sectional view showing a manufacturing process of the display device according to an embodiment.

At this time, the first layer 202 and the third layer 206 are formed to cover substantially the entire surface of the substrate 102, while the second layer 204 are formed to cover the display region 106 and the contact electrode 222 but not to cover the third region 218 and the power supply terminal 118. Thereafter, as shown in FIG. 18, the resin film 210 is formed. The resin film 210 is formed to selectively cover the display region 106 and the contact electrode 222. The first layer 202 and the third layer 206 that are not covered with the resin film 210 are removed by etching using the resin film 210 as a mask. Thus, the wiring 220 is exposed in the third region 218, and at the time, the protective electrode 222*c* of the power supply terminal 118 is exposed, so that electrical connection with the FPC 114 is enabled.

Although not shown, thereafter, the support film 128 is provided on the resin film 210, light irradiation is performed through the support substrate 103 to reduce the adhesion between the support substrate 103 and the substrate 102, and the support substrate is peeled off. By providing the support film 126 after peeling off the support substrate 103, the display device 100 is obtained.

As described above, in the embodiment, by covering the third region 218 of the substrate 102 with the resist mask and removing the undercoat 160 by etching, the third region of the substrate 102 is exposed, and the unevenness is formed on the exposed surface. Then, by the wiring is formed on the surface, the adhesion between the substrate 102 and the wiring is improved by the anchoring effect due to the unevenness, and it is possible to suppress the wiring from being peeled off from the substrate and the disconnection. As a result, the disconnection of wiring for supplying video signals and power can be prevented. Further, The insulating films such as the undercoat 160, the interlayer insulating film 170, and the planarizing film 176 are not provided in the region to be bent of the display device 100 (the third region 218). Thus, the third region 218 can be provided with high flexibility. Further, since there is no brittle insulating film in the third region 218 to be bent, a reliability reduction of the display device 100 does not decrease due to the breakdown of the insulating films. Therefore, it is possible to provide a low-cost and a highly reliable display device.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

In the present specification, an EL display device is mainly described as a disclosure example, but, any flat panel display device such as another self-luminous display device, a liquid crystal display device, or an electronic paper display device including an electrophoretic element can be used as other application examples. In addition, the present invention is not particular limited and can be applied from a medium and small display to a large display.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:

a substrate;

an insulating layer in contact with a first surface of the substrate;

a display region in which a plurality of pixels each including a transistor and a display element on the insulating layer are arranged;

a terminal region located in a region outside the display region over the insulating layer;

at least one wiring between the display region and the terminal region; and a resin film on the substrate, wherein the substrate is a sheet-like member including fibers which are impregnated with a resin, the insulating layer includes an opening in a region between the display region and the terminal region, the resin film is in contact with the first surface in the opening, the wiring is in contact with an upper surface of the resin film through the opening, and a surface roughness of the resin film in the opening is larger than a surface roughness of the substrate at a region where the substrate is in contact with the insulating layer.

2. The display device according to claim 1, wherein the at least one wiring includes a plurality of wirings, and in a plan view, a side surface of the opening comprises a curved portion between two of the wirings which are adjacent to each other.

3. The display device according to claim 1, wherein a part of the fibers is exposed at the opening.

4. The display device according to claim 1, wherein the fibers are high-strength fibers of an organic compound.

5. The display device according to claim 1, wherein the fibers are high-strength fibers of an inorganic compound.

6. The display device according to claim 1, wherein the substrate is curved in a region in which the opening is located.

* * * * *